United States Patent
Hu et al.

(10) Patent No.: US 11,270,623 B2
(45) Date of Patent: Mar. 8, 2022

(54) SHIFT REGISTER UNIT AND DRIVING METHOD THEREOF, GATE DRIVE CIRCUIT AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Qi Hu, Beijing (CN); Hui Jing, Beijing (CN); Weijing Liao, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 543 days.

(21) Appl. No.: 16/335,752

(22) PCT Filed: Aug. 15, 2018

(86) PCT No.: PCT/CN2018/100700
§ 371 (c)(1),
(2) Date: Mar. 22, 2019

(87) PCT Pub. No.: WO2019/134369
PCT Pub. Date: Jul. 11, 2019

(65) Prior Publication Data
US 2021/0350739 A1 Nov. 11, 2021

(30) Foreign Application Priority Data

Jan. 2, 2018 (CN) .......................... 201810002722.9

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0286* (2013.01)

(58) Field of Classification Search
CPC ... G09G 3/20; G09G 2310/0286; G11C 19/28
See application file for complete search history.

(56) References Cited

U.S. PATENT DOCUMENTS

| | | | | |
|---|---|---|---|---|
| 10,547,316 | B2* | 1/2020 | Takasugi | ................ H03K 21/18 |
| 2015/0346904 | A1 | 12/2015 | Long et al. | |
| 2016/0266699 | A1* | 9/2016 | Zhao | .................... G11C 19/287 |

FOREIGN PATENT DOCUMENTS

| | | |
|---|---|---|
| CN | 104021769 A | 9/2014 |
| CN | 106409253 A | 2/2017 |
| CN | 107909959 A | 4/2018 |

OTHER PUBLICATIONS

Nov. 17, 2018—(WO) International Search Report and Written Opinion application PCT/CN2018/100700 with English Translation.

* cited by examiner

*Primary Examiner* — Xuemei Zheng
(74) *Attorney, Agent, or Firm* — Banner & Witcoff, Ltd.

(57) ABSTRACT

A shift register unit and a driving method therof, a gate drive circuit and a display device are disclosed. The shift register unit includes an input circuit, a reset circuit, a first anti-leakage circuit and an output circuit. Because the signal of the pull-up node is provided to the first node and the second node by the first anti-leakage circuit, internal potential difference among the input circuit, the reset circuit, and the first anti-leakage circuit is relatively small, the input circuit is connected with the pull-up node, the reset circuit is connected with the pull-up node and the second node (Continued)

simulatneously, and the first anti-leakage circuit is connected with the first node, the pull-up node and the second node simultaneously.

20 Claims, 9 Drawing Sheets

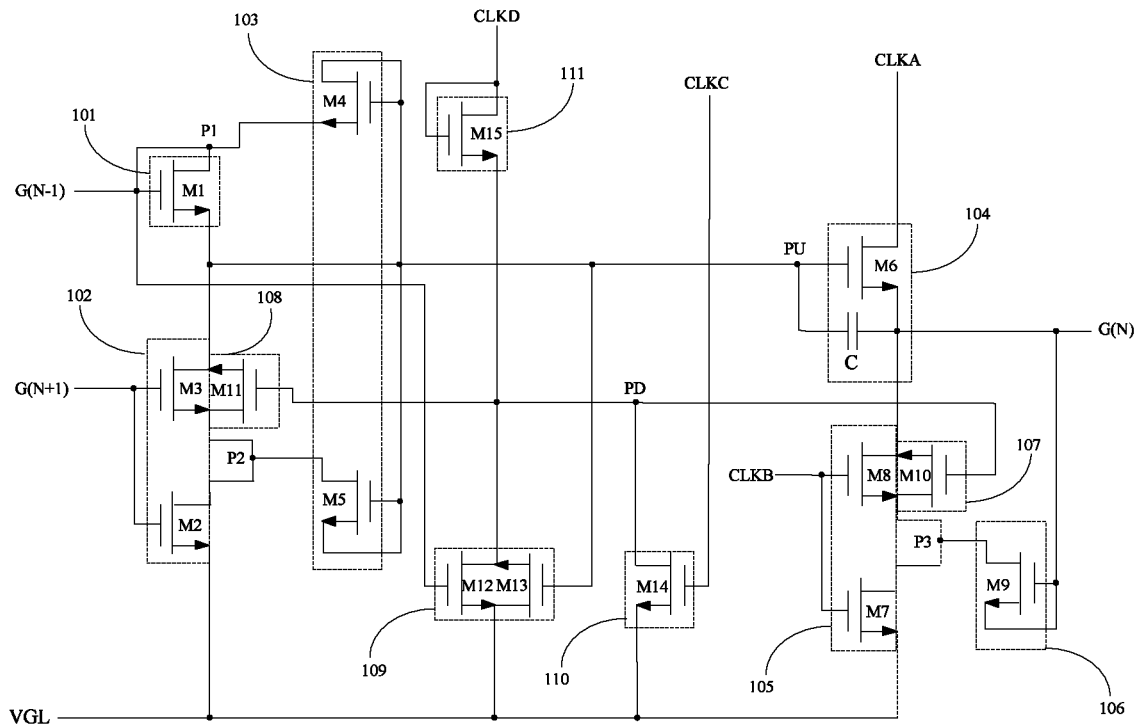

FIG. 2B

| in first stage, input circuit provides a signal of first signal input terminal to pull-up node via first node under control of first signal input terminal; first anti-leakage circuit provides a signal of pull-up node to first node and second node under control of pull-up node; output circuit supplies a signal of first clock signal input terminal to signal output terminal under control of pull-up node | ← S301 |

| in second stage, first anti-leakage circuit supplies a signal of pull-up node to first node and second node under control of pull-up node; output circuit provides a signal of first clock signal input terminal to signal output terminal under control of pull-up node | ← S302 |

| in third stage, reset circuit supplies a signal of first voltage input terminal to pull-up node via second node under control of second signal input terminal | ← S303 |

FIG. 3A

SHIFT REGISTER UNIT AND DRIVING METHOD THEREOF, GATE DRIVE CIRCUIT AND DISPLAY DEVICE

The application is a U.S. National Phase Entry of International Application No. PCT/CN2018/100700 filed on Aug. 15, 2018, designating the United States of America and claiming priority to Chinese Patent Application No. 201810002722.9, filed Jan. 2, 2018. The present application claims priority to and the benefit of the above-identified applications and the above-identified applications are incorporated by reference herein in their entirety.

TECHNICAL FIELD

Embodiments of the present disclosure relate to a shift register unit and a driving method thereof, a gate drive circuit and a display device.

BACKGROUND

In a flat-panel display panel, a gate turning-on (ON) signal is usually supplied to a gate electrode of each thin film transistor (TFT) in a pixel region by a gate drive circuit. For example, the gate drive circuit may be formed on an array substrate of the flat-panel display panel by way of a gate driver on array (GOA) process, and with this integration process, not only the cost is saved, but also the aesthetic design of bilateral symmetry for the flat-panel display panel can be achieved. Moreover, the wiring space of a bonding area and a fan-out area of a gate Integrated Circuit (IC) can be eliminated as well, so that the design of narrow frame can be realized.

The gate drive circuit is formed of a plurality of cascaded shift register units, and the shift register unit at each level is configured for providing a gate ON signal to the gate line that is connected to the signal output terminal of the shift register unit so as to switch on thin film transistor of the pixel region in a corresponding row. In addition to the shift register unit at the first level, signal input terminals of shift register units at the remaining levels are respectively connected with signal output terminals of shift register units at the previous level. In the shift register unit at each level, there is included a pull-up node for control of outputting of the gate ON signal from the signal output terminal, and when the potential of the pull-up node is further raised, the gate ON signal is outputted from the signal output terminal. The thin film transistors in a gate drive circuit are generally oxide thin film transistors of depletion type. Due to restriction of characteristics of the oxide thin film transistors of depletion type themselves, if the potential difference between source electrodes and drain electrodes of the oxide thin film transistors of depletion type connected to pull-up nodes is relatively big, the pull-up nodes are subjected to phenomenon of electricity leakage via these oxide thin film transistors of depletion type.

SUMMARY

At least an embodiment of the present disclosure provides a shift register unit, comprising an input circuit, a reset circuit, a first anti-leakage circuit and an output circuit, wherein the input circuit is connected with a first signal input terminal, a first node and a pull-up node, and configured for providing a signal of the first signal input terminal to the pull-up node via the first node under control of the first signal input terminal; the reset circuit is connected with a second signal input terminal, a first voltage input terminal, a second node and the pull-up node, and configured for providing a signal of the first voltage input terminal to the pull-up node via the second node under control of the second signal input terminal; the first anti-leakage circuit is connected with the pull-up node, the first node and the second node, and configured for providing a signal of the pull-up node to the first node and the second node under control of the pull-up node; and the output circuit is connected with the pull-up node, a first clock signal input terminal and a signal output terminal, and configured for providing a signal of the first clock signal input terminal to the signal output terminal under control of the pull-up node.

For example, in the shift register unit of at least an embodiment of the present disclosure, the input circuit includes a first switch transistor, a gate electrode of the first switch transistor is connected to the first signal input terminal, a first electrode of the first switch transistor is connected to the first signal input terminal via the first node, and a second electrode of the first switch transistor is connected to the pull-up node.

For example, in the shift register unit of at least an embodiment of the present disclosure, the reset circuit includes a second switch transistor and a third switch transistor, a gate electrode of the second switch transistor is connected to the second signal input terminal, a first electrode of the second switch transistor is connected to the second node, and a second electrode of the second switch transistor is connected to the first voltage input terminal; and a gate electrode of the third switch transistor is connected to the second signal input terminal, a first electrode of the third switch transistor is connected to the pull-up node, and a second electrode of the third switch transistor is connected to the second node.

For example, in the shift register unit of at least an embodiment of the present disclosure, the first anti-leakage circuit includes a fourth switch transistor and a fifth switch transistor, both a gate electrode and a first electrode of the fourth switch transistor are connected with the pull-up node, and a second electrode of the fourth switch transistor is connected to the first node; and both a gate electrode and a second electrode of the fifth switch transistor are connected with the pull-up node, and a first electrode of the fifth switch transistor is connected to the second node.

For example, in the shift register unit of at least an embodiment of the present disclosure, the output circuit includes a sixth switch transistor and a capacitor, a gate electrode of the sixth switch transistor is connected with the pull-up node, a first electrode of the sixth switch transistor is connected to the first clock signal input terminal, and a second electrode of the sixth switch transistor is connected to the signal output terminal; and one end of the capacitor is connected to the pull-up node, and other end of the capacitor is connected to the signal output terminal.

For example, the shift register unit of at least an embodiment of the present disclosure further comprises a first pull-down circuit, wherein the first pull-down circuit is connected with a second clock signal input terminal, the first voltage input terminal, the third node and the signal output terminal, and configured for supplying the signal of the first voltage input terminal to the signal output terminal via the third node under control of the second clock signal input terminal.

For example, in the shift register unit of at least an embodiment of the present disclosure, the first pull-down circuit includes a seventh switch transistor and an eighth switch transistor, a gate electrode of the seventh switch transistor is connected to the second clock signal input terminal, a first electrode of the seventh switch transistor is connected to the third node, and a second electrode of the seventh switch transistor is connected to the first voltage input terminal; and a gate electrode of the eighth switch transistor is connected to the second clock signal input terminal, a first electrode of the eighth switch transistor is connected to the signal output terminal, and the second electrode of the eighth switch transistor is connected to the third node.

For example, the shift register unit of at least an embodiment of the present disclosure further comprises a second pull-down circuit, wherein the second pull-down circuit is connected to the signal output terminal and the third node, and configured for providing a signal of the signal output terminal to the third node under control of the signal output terminal.

For example, in the shift register unit of at least an embodiment of the present disclosure, the second pull-down circuit includes a ninth switch transistor, both a gate electrode and a second electrode of the ninth switch transistor are connected to the signal output terminal, and a first electrode of the ninth switch transistor is connected to the third node.

For example, the shift register unit of at least an embodiment of the present disclosure further comprises a signal-output-terminal de-noising circuit, a pull-up-node de-noising circuit, a pull-down-node first control circuit, a pull-down-node second control circuit and a pull-down-node third control circuit, wherein the signal-output-terminal de-noising circuit is connected with the third node, the signal output terminal and the pull-down node, and configured to supply the signal of the signal output terminal to the third node under control of the pull-down node; the pull-up-node de-noising circuit is connected with the pull-up node, the second node and the pull-down node, and configured to supply the signal of the pull-up node to the second node under control of the pull-down node; the pull-down-node first control circuit is connected with the first signal input terminal, the pull-up node, the pull-down node and the first voltage input terminal, and configured for supplying the signal of the first voltage input terminal to the pull-down node under control of the first signal input terminal and/or the pull-up node; the pull-down-node second control circuit is connected with a third clock signal input terminal, the pull-down node and the first voltage input terminal, and configured for supplying the signal of the first voltage input terminal to the pull-down node under control of the third clock signal input terminal; and the pull-down-node third control circuit is connected with a fourth clock signal input terminal and the pull-down node, and configured for providing a signal of the fourth clock signal input terminal to the pull-down node under control of the fourth clock signal input terminal.

For example, in the shift register unit of at least an embodiment of the present disclosure, the signal-output-terminal de-noising circuit includes a tenth switch transistor, a gate electrode of the tenth switch transistor is connected to the pull-down node, a first electrode of the tenth switch transistor is connected to the third node, and a second electrode of the tenth switch transistor is connected to the signal output terminal.

For example, in the shift register unit of at least an embodiment of the present disclosure, the pull-up-node de-noising circuit includes an eleventh switch transistor, a gate electrode of the eleventh switch transistor is connected to the pull-down node, a first electrode of the eleventh switch transistor is connected to the second node, and a second electrode of the eleventh switch transistor is connected to the pull-up node.

For example, in the shift register unit of at least an embodiment of the present disclosure, the pull-down-node first control circuit includes a twelfth switch transistor and a thirteenth switch transistor, a gate electrode of the twelfth switch transistor is connected to the first signal input terminal, a first electrode of the twelfth switch transistor is connected to the pull-down node, and a second electrode of the twelfth switch transistor is connected to the first voltage input terminal; and a gate electrode of the thirteenth switch transistor is connected to the pull-up node, a first electrode of the thirteenth switch transistor is connected to the first voltage input terminal, and a second electrode of the thirteenth switch transistor is connected to the pull-down node.

For example, in the shift register unit of at least an embodiment of the present disclosure, the pull-down-node second control circuit includes a fourteenth switch transistor, a gate electrode of the fourteenth switch transistor is connected to the third clock signal input terminal, a first electrode of the fourteenth switch transistor is connected to the pull-down node, and a second electrode of the fourteenth switch transistor is connected to the first voltage input terminal.

For example, in the shift register unit of at least an embodiment of the present disclosure, the pull-down-node third control circuit includes a fifteenth switch transistor, both a gate electrode and a first electrode of the fifteenth switch transistor are connected to the fourth clock signal input terminal, and a second electrode of the fifteenth switch transistor is connected to the pull-down node.

At least an embodiment of the present disclosure provides a gate drive circuit comprising a plurality of the above mentioned cascaded shift register units, a first signal input terminal of a shift register unit at a first level is connected with a frame trigger signal terminal; except for the shift register unit at the first level, a first signal input terminal of a shift register unit at each of the remaining levels is respectively connected to a signal output terminal of a shift register unit at a previous level that is adjacent to each of the remaining levels; and except for a shift register unit at a last level, a second signal input terminal of a shift register unit at each of the remaining levels is respectively connected to a signal output terminal of a shift register unit at a next level that is adjacent to each of the remaining levels.

At least an embodiment of the present disclosure provides a display device, comprising the above mentioned gate drive circuit claimed.

At least an embodiment of the present disclosure provides a driving method of the above mentioned shift register unit, comprising: in a first stage, the input circuit supplying the signal of the first signal input terminal to the pull-up node via the first node under control of the first signal input terminal; the first anti-leakage circuit supplying the signal of the pull-up node to the first node and the second node under control of the pull-up node; the output circuit supplying the signal of the first clock signal input terminal to the signal output terminal under control of the pull-up node; in a second stage, the first anti-leakage circuit supplying the signal of the pull-up node to the first node and the second node under control of the pull-up node; the output circuit supplying the signal of the first clock signal input terminal to the signal output terminal under control of the pull-up node; and in a third stage, the reset circuit providing the signal of the first voltage input terminal to the pull-up node via the second node under control of the second signal input terminal.

For example, the driving method of at least an embodiment of the present disclosure the method further comprises: the first pull-down circuit providing the signal of the first voltage input terminal to the signal output terminal via the third node under control of the second clock signal terminal.

For example, in the driving method of at least an embodiment of the present disclosure, in the second stage, the method further comprises: the second pull-down circuit providing the signal of the signal output terminal to the third node under control of the signal output terminal.

At least an embodiment of the present disclosure provides a driving method of the above mentioned shift register unit, comprising: in a first stage, the input circuit supplying the signal of the first signal input terminal to the pull-up node via the first node under control of the first signal input terminal; the first anti-leakage circuit supplying the signal of the pull-up node to the first node and the second node under control of the pull-up node; the output circuit supplying the signal of the first clock signal input terminal to the signal output terminal under control of the pull-up node; in a second stage, the first anti-leakage circuit supplying the signal of the pull-up node to the first node and the second node under control of the pull-up node; the output circuit supplying the signal of the first clock signal input terminal to the signal output terminal under control of the pull-up node; in a third stage, the reset circuit providing the signal of the first voltage input terminal to the pull-up node via the second node under control of the second signal input terminal; in a fourth stage, the pull-down-node second control circuit supplying the signal of the first voltage input terminal to the pull-down node under control of the third clock signal input terminal; and in a fifth stage, the pull-down-node third control circuit providing a signal of the fourth clock signal input terminal to the pull-down node under control of the fourth clock signal input terminal.

For example, in the driving method of at least an embodiment of the present disclosure, in the first stage, the method further comprises: the pull-down-node first control circuit providing the signal of the first voltage input terminal to the pull-down node under joint control of the first signal input terminal and the pull-up node.

For example, in the driving method of at least an embodiment of the present disclosure, in the second stage, the method further comprises: the second pull-down circuit supplying the signal of the signal output terminal to the third node under control of the signal output terminal; the pull-down-node first control circuit providing the signal of the first voltage input terminal to the pull-down node under control of the pull-up node.

For example, in the driving method of at least an embodiment of the present disclosure, in the third stage, the method further comprises: the first pull-down circuit supplying the signal of the first voltage input terminal to the signal output terminal via the third node under control of the second clock signal output terminal.

For example, in the driving method of at least an embodiment of the present disclosure, in the fifth stage, the method further comprises: the pull-up-node de-noising circuit providing the signal of the pull-up node to the second node under control of the pull-down node; the signal-output-terminal de-noising circuit supplying the signal of the signal output terminal to the third node under control of the pull-down node.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2A and FIG. 2B are schematic views illustrating the specific structure of a shift register unit provided by an embodiment of the present disclosure, respectively;

FIG. 3A is a flowchart illustrating driving method of the shift register unit illustrated in FIG. 2A provided by an embodiment of the present disclosure;

DESCRIPTION OF THE PREFERRED EMBODIMENTS

Figure 1A:
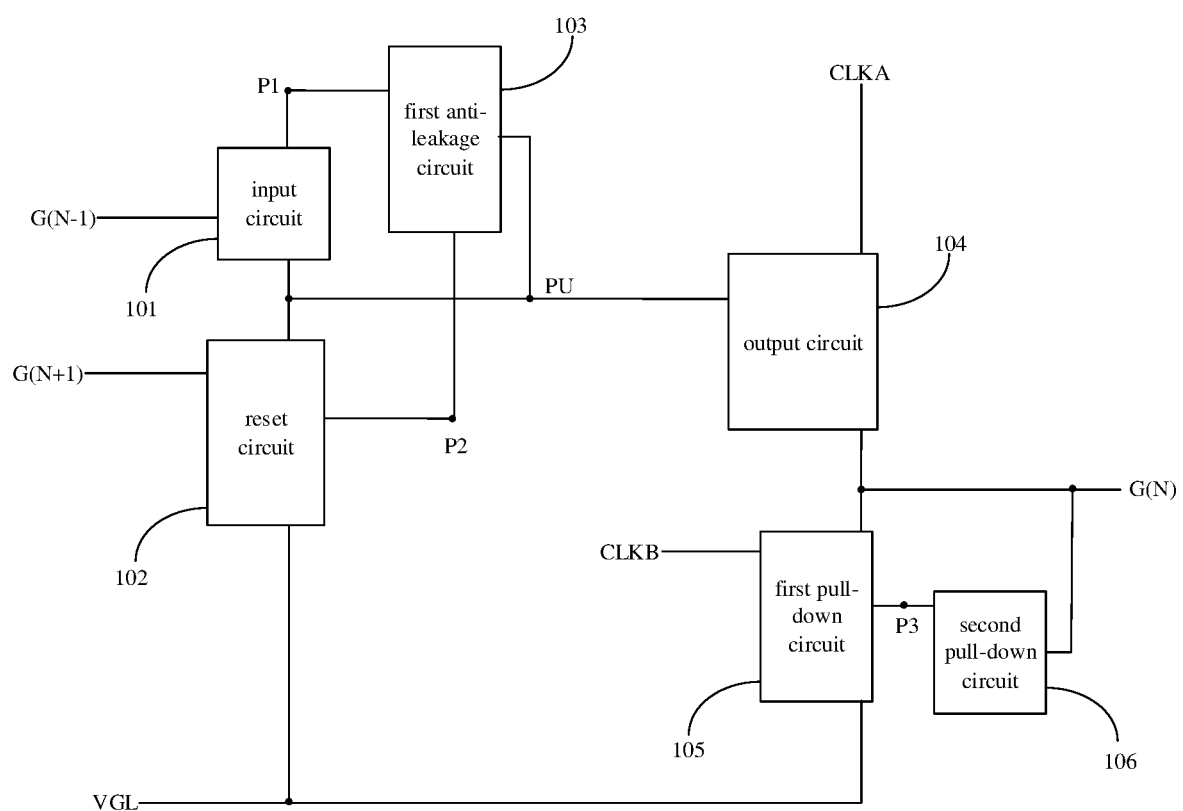
FIG. 1A and FIG. 1B are structurally schematic views illustrating a shift register unit provided by an embodiment of the present disclosure, respectively.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Hereinafter, specific embodiments of a shift register unit and its driving method, a gate drive circuit and a display device provided by embodiments of the present disclosure will be illustrated in detail. It should be noted that, embodiments described in this specification are merely a part of embodiments of the present disclosure, but not all embodiments; and, in case of no confliction, embodiments in the present application and characteristics in the embodiments can be combined with each other. In addition, based on the embodiments in the present disclosure, all other embodiments, as would be obtained by those ordinarily skilled in the art without creative labor, fall within the scope protected by the present disclosure.

Embodiments of the present disclosure provide a shift register unit and a driving method thereof, a gate drive circuit and a display device. The shift register unit includes an input circuit, a reset circuit, a first anti-leakage circuit and an output circuit; the input circuit is connected with a first signal input terminal, a first node and a pull-up node, and configured for providing signal of the first signal input terminal to the pull-up node via the first node under the control of the first signal input terminal; the reset circuit is connected with a second signal input terminal, a first voltage input terminal, a second node and the pull-up node, and configured for providing signal of the first voltage input terminal to the pull-up node via the second node under the control of the second signal input terminal; the first anti-leakage circuit is connected with the pull-up node, the first node and the second node, and configured for providing signal of the pull-up node to the first node and the second node under the control of the pull-up node; the output circuit is connected with the pull-up node, a first clock signal input terminal and a signal output terminal, and configured for providing signal of the first clock signal input terminal to the signal output terminal under the control of the pull-up node. Because the signal of the pull-up node is provided to the first node and the second node by the first anti-leakage circuit, internal potential difference among the input circuit, the reset circuit, and the first anti-leakage circuit is relatively small, the input circuit is connected with the pull-up node, the reset circuit is connected with the pull-up node and the second node simultaneously, and the first anti-leakage circuit is connected with the first node, the pull-up node and the second node simultaneously. Thus, the phenomenon is avoided that the pull-up node produces a leakage current through the first anti-leakage circuit, the input circuit and the reset circuit that are connected to the pull-up node, and the pull-up node is prevented from leaking electricity via a transistor connected to the pull-up node. Consequently, the stability of signal output of the output circuit is guaranteed.

For example, a shift register unit provided by an embodiment of the present disclosure, as illustrated in FIG. 1A, FIG. 1B, FIG. 2A and FIG. 2B, includes an input circuit 101, a reset circuit 102, a first anti-leakage circuit 103 and an output circuit 104.

The input circuit 101 is connected with a first signal input terminal G(N−1) and a pull-up node, and is configured to provide a signal of the first signal input terminal G(N−1) to the pull-up node PU under the control of the first signal input terminal G(N−1).

The reset circuit 102 is connected to the second signal input terminal G(N+1), a first voltage input terminal VGL, a second node P2, and the pull-up node PU, and is configured to supply a signal of the first voltage input terminal VGL to the pull-up node PU via the second node P2 under the control of the second signal input terminal G(N+1).

A first anti-leakage circuit 103 is connected with the pull-up node PU, a first node P1 and the second node P2, and is configured to provide a signal of the pull-up node PU to the first node P1 and the second node P22 under the control of the pull-up node PU.

The output circuit 104 is connected with the pull-up node PU, a first clock signal input terminal CLKA, and a signal output terminal G(N), and is configured for supplying a signal of the first clock signal input terminal CLKA to the signal output terminal G(N) under the control of the pull-up node PU.

In the above shift register unit provided by an embodiment of the present disclosure, due to the situation that the signal of the pull-up node PU is provided to the first node P1 and the second node P2 by the first anti-leakage circuit 103, the internal potential difference becomes relatively small among the input circuit 101 connected with the first node P1 and the pull-up node PU simultaneously, the reset circuit 102 connected with the pull-up node PU and the second node P2 simultaneously, and the first anti-leakage circuit 103 connected with the first node P1, the pull-up node PU and the second node P2 simultaneously. Thus, it is avoided that the pull-up node PU produces a leakage current by the way of the first anti-leakage circuit 103, the input circuit 101 and the reset circuit 102 that are connected thereto, and the stability of signal output of the output circuit 104 is guaranteed.

Furthermore, shift register units usually use two voltage signals, i.e., a DC high-level signal and a DC low-level signal, while in the shift register units provided by an embodiment of the present disclosure, only a DC low-level signal provided by the first voltage input terminal VGL is used, thus simplifying the circuit structure thereof.

The present disclosure will be illustrated in detail below in combination with specific embodiments. It should be noted that, the present embodiment is intended to better explain the present disclosure, but not to limit the present disclosure.

Figure 2A:
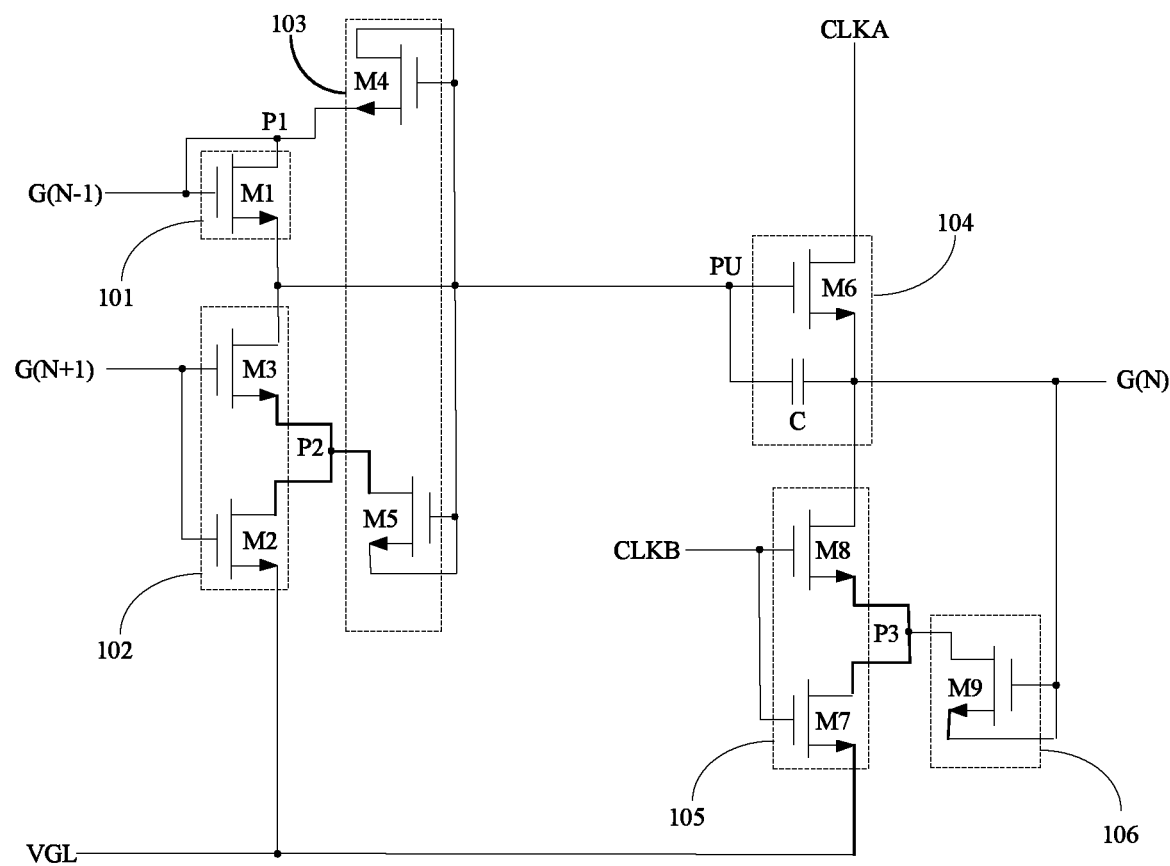

For example, in the aforementioned shift register unit provided by an embodiment of the present disclosure, as illustrated in FIGS. 2A and 2B, the input circuit 101 includes a first switch transistor M1.

A gate electrode of the first switch transistor M1 is connected to the first signal input terminal G(N−1), a first electrode of the first switch transistor M1 is connected to the first signal input terminal G(N−1) via the first node P1, and a second electrode of the first switch transistor M1 is connected to the pull-up node PU.

For example, in the aforesaid shift register unit provided by an embodiment of the present disclosure, the first switch transistor M1 is switched on under the control of the first signal input terminal G(N−1), and writes the signal of the first signal input terminal G(N−1) to the pull-up node PU via the first node P1.

Specific structure of the input circuit 101 in the shift register unit has been illustrated merely by way of example. Upon implementation, the specific structure of the input circuit 101 is not limited to the above structure provided by an embodiment of the present disclosure, and it may also be other structure that may be known by those skilled in the art, no limitation being placed here.

For example, in the aforementioned shift register unit provided by an embodiment of the present disclosure, as illustrated in FIGS. 2A and 2B, the reset circuit 102 includes a second switch transistor M2 and a third switch transistor M3.

A gate electrode of the second switch transistor M2 is connected to a second signal input terminal G(N+1), a first electrode of the second switch transistor M2 is connected to the second node P2, and a second electrode of the second switch transistor M2 is connected to the first voltage input terminal VGL.

A gate electrode of the third switch transistor M3 is connected to the second signal input terminal G(N+1), a first electrode of the third switch transistor M3 is connected to the pull-up node PU, and a second electrode of the third switch transistor M3 is connected with the second node P2.

For example, in the above shift register unit provided by an embodiment of the present disclosure, both the second switch transistor M2 and the third switch transistor M3 are switched on under the control of the second signal input terminal G(N+1), and the signal of the first voltage input terminal VGL is written to the pull-up node PU via the second switch transistor M2 that is switched on, the second node P2 and the third switch transistor M3 that is switched on sequentially, so as to reset the pull-up node PU.

Specific structure of the reset circuit 102 in the shift register unit has been illustrated merely by way of example. Upon implementation, the specific structure of the reset circuit 102 is not limited to the above structure provided by an embodiment of the present disclosure, and it may also be other structure that may be known by those skilled in the art, no limitation being placed here.

For example, in the aforementioned shift register unit provided by an embodiment of the present disclosure, as illustrated in FIGS. 2A and 2B, the first anti-leakage circuit 103 includes a fourth switch transistor M4 and a fifth switch transistor M5.

A gate electrode and a first electrode of the fourth switch transistor M4 are each connected with the pull-up node PU, and a second electrode of the fourth switch transistor M4 is connected with the first node P1.

A gate electrode and a second electrode of the fifth switch transistor M5 are each connected to the pull-up node PU, and a first electrode of the fifth switch transistor M5 is connected to the second node P2.

For example, in the above shift register unit provided by an embodiment of the present disclosure, both the fourth switch transistor M4 and the fifth switch transistor M5 are switched on under the control of the pull-up node PU, so as to write the signal of the pull-up node PU to the first node P1 and the second node P2 via the fourth switch transistor M4 and the fifth switch transistor M5, which have been switched on, respectively. The first electrode of the fourth switch transistor M4 is connected to the pull-up node PU, the second electrode of the fourth switch transistor M4 is connected to the first node Pl; the first electrode of the fifth switch transistor M5 is connected to the second node P2, and the second electrode of the fifth switch transistor M5 is connected with the pull-up node PU. The first electrode of the first switch transistor M1 is connected with the first node Pl, and the second electrode of the first switch transistor M1 is connected with the pull-up node PU; the first electrode of the third switch transistor M3 is connected to the pull-up node PU, and the second electrode of the third switch transistor M3 is connected to the second node P2. Therefore, the potential difference between the first electrode of the first switch transistor M1 and its second electrode, the potential difference between the first electrode of the third switch transistor M3 and its second electrode, the potential difference between the first electrode of the fourth switch transistor M4 and its second electrode, and the potential difference between the first electrode of the fifth switch transistor M5 and its second electrode are all relatively small. Consequently, it is avoided that the pull-up node PU produces a leakage current by the way of the first switch transistor M1, the third switch transistor M3, the fourth switch transistor M4 and the fifth switch transistor M5 connected to the pull-up node PU.

Specific structure of the first anti-leakage circuit 103 in the shift register unit has been illustrated merely by way of example. Upon implementation, the specific structure of the first anti-leakage circuit 103 is not limited to the above structure provided by an embodiment of the present disclosure, and it may also be other structure that can be known by those skilled in the art, no limitation being placed here.

For example, in the aforementioned shift register unit provided by an embodiment of the present disclosure, as illustrated in FIGS. 2A and 2B, the output circuit 104 includes a sixth switch transistor M6 and a capacitor C.

A gate electrode of the sixth switch transistor M6 is connected with the pull-up node PU, a first electrode of the sixth switch transistor M6 is connected with the first clock signal input terminal CLKA, and a second electrode of the sixth switch transistor M6 is connected with the signal output terminal G(N).

One end of the capacitor C is connected to the pull-up node PU, and the other end of the capacitor C is connected to the signal output terminal G(N).

For example, in the above shift register unit provided by an embodiment of the present disclosure, the capacitor C starts to be charged at the same time that the signal of the first signal input terminal G(N−1) is written to the pull-up node PU via the first switch transistor M1 that is switched on; the sixth switch transistor M6 is switched on under the control of the pull-up node PU, and a low-level signal of the first clock signal input terminal CLKA is written to the signal output terminal G(N) via the sixth switch transistor M6 that is switched on. After that, due to the existence of capacitor C, the potential of the pull-up node PU is maintained, and further the potential of the pull-up node PU is raised because of the bootstrap effect of the capacitor C. As a result, the sixth switch transistor M6 is fully turned on, and a high-level signal of the first clock signal input terminal CLKA is written to the signal output terminal G(N) via the switched-on sixth switch transistor M6. Because the pull-up node PU does not suffer from leaking of electricity, the stability and accuracy of output of a gate ON signal from the signal output terminal G(N) are guaranteed.

Specific structure of the output circuit 104 in the shift register unit has been illustrated merely by way of example. Upon implementation, the specific structure of the output circuit 104 is not limited to the above structure provided by an embodiment of the present disclosure, and it may also be other structure that can be known by those skilled in the art, no limitation being placed here.

For example, in the aforementioned shift register unit provided by an embodiment of the present disclosure, as illustrated in FIG. 1A, FIG. 1B, FIG. 2A and FIG. 2B, the shift register unit further includes a first pull-down circuit 105.

The first pull-down circuit 105 is connected to a second clock signal input terminal CLKB, the first voltage input terminal VGL, a third node P3, and the signal output terminal G(N), and is configured to supply the signal of the first voltage input terminal VGL to the signal output terminal G(N) via the third node P3 under the control of the second clock signal input terminal CLKB.

Further, in the aforementioned shift register unit provided by an embodiment of the present disclosure, as illustrated in FIGS. 2A and 2B, the first pull-down circuit 105 includes a seventh switch transistor M7 and an eighth switch transistor M8.

A gate electrode of the seventh switch transistor M7 is connected to the second clock signal input terminal CLKB, a first electrode of the seventh switch transistor M7 is connected to the third node P3, and a second electrode of the seventh switch transistor M7 is connected with the first voltage input terminal VGL.

A gate electrode of the eighth switch transistor M8 is connected to the second clock signal input terminal CLKB, a first electrode of the eighth switch transistor M8 is connected to the signal output terminal G(N), and a second electrode of the eighth switch transistor M8 is connected with the third node P3.

For example, in the above shift register unit provided by an embodiment of the present disclosure, both the seventh switch transistor M7 and the eighth switch transistor M8 are switched on under the control of the second clock signal input terminal CLKB, and the signal of the first voltage input terminal VGL is written to the signal output terminal G(N) via the switched-on seventh switch transistor M7, the third node P3, and the switched-on eighth switch transistor M8 in sequential, so as to reset the signal output terminal G(N).

Specific structure of the first pull-down circuit 105 in the shift register unit has been illustrated above merely by way of example. Upon implementation, the specific structure of the first pull-down circuit 105 is not limited to the above structure provided by an embodiment of the present disclosure, and it may also be other structure that can be known by those skilled in the art, no limitation being placed here.

For example, in the aforementioned shift register unit provided by an embodiment of the present disclosure, as illustrated in FIG. 1A, FIG. 1B, FIG. 2A and FIG. 2B, the shift register unit further includes a second pull-down circuit 106.

The second pull-down circuit 106 is connected with the signal output terminal G(N) and the third node P3, and is configured for supplying the signal of the signal output terminal G(N) to the third node P3 under the control of the signal output terminal G(N). Further, in the above shift register unit provided by an embodiment of the present disclosure, as illustrated in FIGS. 2A and 2B, the second pull-down circuit 106 includes a ninth switch transistor M9.

A gate electrode and a second electrode of the ninth switch transistor M9 each are connected to the signal output terminal G(N), and a first electrode of the ninth switch transistor M9 is connected to the third node P3.

For example, in the above shift register unit provided by an embodiment of the present disclosure, the ninth switch transistor M9 is switched on under the control of the signal output terminal G(N), and writes the signal of the signal output terminal G(N) to the third node P3 and then supplies the signal to the first pull-down circuit 105, that is, supplies the signal to the second electrode of the eighth switch transistor M8 in the first pull-down circuit 105. Because the second electrode of the ninth switch transistor M9 is connected to the signal output terminal G(N), the first electrode of the ninth switch transistor M9 is connected with the third node P3, the second electrode of the eighth switch transistor M8 is connected to the third node P3, and the first electrode of the eighth switch transistor M8 is connected to the signal output terminal G(N), the potential difference between the first electrode of the eighth switch transistor M8 and its second electrode and the potential difference between the first electrode of the ninth switch transistor M9 and its second electrode are both relatively low. Therefore, the signal output terminal G(N) is restrained from engendering leakage of charge via the eighth switch transistor M8 and the ninth switch transistor M9 connected to the signal output terminal G(N), and furthermore, the stability and accuracy of outputting of a gate ON signal from the signal output terminal G(N) are ensured.

Specific structure of the second pull-down circuit 106 in the shift register unit has been illustrated above merely by way of example. Upon implementation, the specific structure of the second pull-down circuit 106 is not limited to the above structure provided by an embodiment of the present disclosure, and it may also be other structure that can be known by those skilled in the art, no limitation being placed here.

Figure 1B:
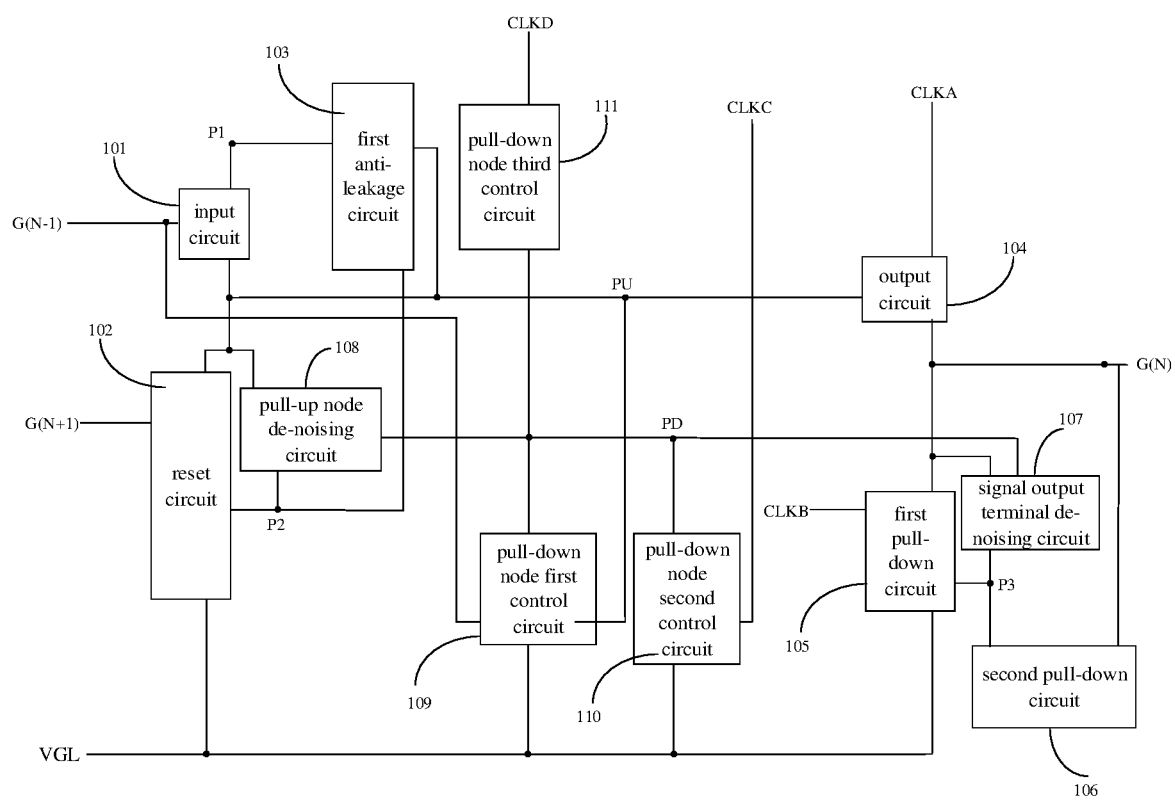

For example, in the aforementioned shift register unit provided by an embodiment of the present disclosure, as illustrated in FIGS. 1B and 2B, the shift register unit further includes a signal-output-terminal de-noising circuit 107, a pull-up-node de-noising circuit 108, and a pull-down-node first control circuit 109, a pull-down-node second control circuit 110, and a pull-down-node third control circuit 111.

The signal-output-terminal de-noising circuit 107 is connected with the third node P3, the signal output terminal G(N) and the pull-down node PD, and is configured for supplying the signal of the signal output terminal G(N) to the third node P3 under the control of the pull-down node PD.

The pull-up-node de-noising circuit 108 is connected to the pull-up node PU, the second node P2 and the pull-down node PD, and configured for supplying the signal of the pull-up node PU to the second node P2 under the control of the pull-down node PD.

The pull-down-node first control circuit 109 is connected with the first signal input terminal G(N−1), the pull-up node PU, the pull-down node PD and the first voltage input terminal VGL, and configured for providing signal of the first voltage input terminal VGL to the pull-down node PD under the control of the first signal input terminal G(N−1) and/or the pull-up node PU The pull-down-node second control circuit 110 is connected with a third clock signal input terminal CLKC, the pull-down node PD and the first voltage input terminal VGL, and configured for supplying the signal of the first voltage input terminal VGL to the pull-down node PD under the control of the third clock signal input terminal CLKC.

The pull-down-node third control circuit 111 is connected with the fourth clock signal input terminal CLKD and the pull-down node PD, and configured for supplying the signal of the fourth clock signal input terminal CLKD to the pull-down node PD under the control of the fourth clock signal input terminal CLKD.

For example, in the aforementioned shift register unit provided by an embodiment of the present disclosure, as illustrated in FIG. 2B, the signal-output-terminal de-noising circuit 107 includes a tenth switch transistor M10.

A gate electrode of the tenth switch transistor M10 is connected to the pull-down node PD, a first electrode of the tenth switch transistor M10 is connected to the third node P3, and a second electrode of the tenth switch transistor M10 is connected with the signal output terminal G(N).

For example, in the above shift register unit provided by an embodiment of the present disclosure, the tenth switch transistor M10 is switched on under the control of the pull-down node PD, and the static electricity accumulated at the signal output terminal G(N) is written into the third node P3 through the switched-on tenth switch transistor M10, so that the static electricity accumulated at the signal output terminal G(N) is outputted, by effect of coupling, from the tenth switch transistor M10 and the seventh switch transistor M7. Thus, the low potential of the signal output terminal G(N) is ensured. Furthermore, when the ninth switch transistor M9 writes the signal of the signal output terminal G(N) to the third node P3, the potential difference between the first electrode and the second electrode of the tenth switch transistor M10 is relatively low, because the second electrode of the tenth switch transistor M10 is connected to the signal output terminal G(N) and the first electrode of the tenth switch transistor M10 is connected to the third node P3. Thus, the signal output terminal G(N) is restrained from engendering leakage of charge through the tenth switch transistor M10 connected to the signal output terminal G(N).

Specific structure of the signal-output-terminal de-noising circuit 107 in the shift register unit has been illustrated above merely by way of example. Upon implementation, the specific structure of the signal-output-terminal de-noising circuit 107 is not limited to the above structure provided by an embodiment of the present disclosure, and it may also be other structure that can be known by those skilled in the art, no limitation being placed here.

For example, in the above shift register unit provided by an embodiment of the present disclosure, as illustrated in FIG. 2B, the pull-up-node de-noising circuit 108 includes an eleventh switch transistor M11.

A gate electrode of the eleventh switch transistor M11 is connected to the pull-down node PD, a first electrode of the eleventh switch transistor M11 is connected to the second node P2, and a second electrode of the eleventh switch transistor M11 is connected with the pull-up node PU.

For example, in the above shift register unit provided by an embodiment of the present disclosure, the eleventh switch transistor M11 is switched on under the control of the pull-down node PD, and the static electricity accumulated at the pull-up node PU is written into the second node P2 through the switched-on eleventh switch transistor M11, so that the static electricity accumulated at the pull-up node PU is outputted, by effect of coupling, from the eleventh switch transistor M11 and the second switch transistor M2. As a result, the low potential of the pull-up node PU is assured. Furthermore, when the fifth switch transistor M5 writes the signal of the pull-up node PU to the second node P2, the potential difference between the first electrode and the second electrode of the eleventh switch transistor M11 is relatively low, because the first electrode of the eleventh switch transistor M11 is connected to the second node P2 and the second electrode of the eleventh switch transistor M11 is connected to the pull-up node PU. Thus, the pull-up node PU is restrained from engendering leakage of charge through the eleventh switch transistor M11 connected to the pull-up node PU.

Specific structure of the pull-up-node de-noising circuit 108 in the shift register unit has been illustrated above merely by way of example. Upon implementation, the specific structure of the pull-up-node de-noising circuit 108 is not limited to the above structure provided by an embodiment of the present disclosure, and it may also be other structure that can be known by those skilled in the art, no limitation being placed here.

For example, in the aforementioned shift register unit provided by an embodiment of the present disclosure, as illustrated in FIG. 2B, the pull-down-node first control circuit 109 includes a twelfth switch transistor M12 and a thirteenth switch transistor M13.

A gate electrode of the twelfth switch transistor M12 is connected to the first signal input terminal G(N−1), a first electrode of the twelfth switch transistor M12 is connected to the pull-down node PD, and a second electrode of the twelfth switch transistor M12 is connected to the first voltage input terminal VGL.

A gate electrode of the thirteenth switch transistor M13 is connected to the pull-up node PU, a first electrode of the thirteenth switch transistor M13 is connected to the first voltage input terminal VGL, and a second electrode of the thirteenth switch transistor M13 is connected with the pull-down node PD.

For example, in the above shift register unit provided by an embodiment of the present disclosure, the twelfth switch transistor M12 is switched on under the control of the first signal input terminal G(N−1), the thirteenth switch transistor M13 is switched on under the control of the pull-up node PU, and the signal of the first voltage input terminal VGL is written to the pull-down node PD through the switched-on twelfth switch transistor M12 and/or the switched-on thirteenth switch transistor M13.

Specific structure of the pull-down-node first control circuit 109 in the shift register unit has been illustrated above merely by way of example. Upon implementation, the specific structure of the pull-down-node first control circuit 109 is not limited to the above structure provided by an embodiment of the present disclosure, and it may also be other structure that can be known by those skilled in the art, no limitation being placed here.

For example, in the aforementioned shift register unit provided by an embodiment of the present disclosure, as illustrated in FIG. 2B, the pull-down-node second control circuit 110 includes a fourteenth switch transistor M14.

A gate electrode of the fourteenth switch transistor M14 is connected to the third clock signal input terminal CLCK, a first electrode of the fourteenth switch transistor M14 is connected to the pull-down node PD, and a second electrode of the fourteenth switch transistor M14 is connected with the first voltage input terminal VGL.

For example, in the above shift register unit provided by an embodiment of the present disclosure, the fourteenth switch transistor M14 is switched on under the control of the third clock signal input terminal CLCK, and the signal of the first voltage input terminal VGL is written to the pull-down node PD via the switched-on fourteenth switch transistor M14.

Specific structure of the pull-down-node second control circuit 110 in the shift register unit has been illustrated above merely by way of example. Upon implementation, the specific structure of the pull-down-node second control circuit 110 is not limited to the above structure provided by an embodiment of the present disclosure, and it may also be other structure that can be known by those skilled in the art, no limitation being placed here.

For example, in the aforementioned shift register unit provided by an embodiment of the present disclosure, as illustrated in FIG. 2B, the pull-down-node third control circuit 111 includes a fifteenth switch transistor M15.

A gate electrode and a first electrode of the fifteenth switch transistor M15 each are connected with a fourth clock signal input terminal CLKD, and a second electrode of the fifteenth switch transistor M15 is connected with the pull-down node PD.

For example, in the above shift register unit provided by an embodiment of the present disclosure, the fifteenth switch transistor M15 is switched on under the control of the fourth clock signal input terminal CLKD, and the signal of the fourth clock signal input terminal CLKD is written to the pull-down node PD via the switched-on fifteenth switch transistor M15, so as to turn on the tenth switch transistor M10 and the eleventh switch transistor M11. In comparison with such a way that a single clock signal is used to control the pull-down node PD, the third clock signal input terminal CLKC and the fourth clock signal input terminal CLKD are used to control the pull-down node PD in an embodiment of the present disclosure, and the degree of negative drift of switch transistors can be alleviated by decreasing the duty cycle of single clock signal, thereby improving the reliability of shift register units.

Specific structure of the pull-down-node third control circuit 111 in the shift register unit has been illustrated above merely by way of example. Upon implementation, the specific structure of the pull-down-node third control circuit 111 is not limited to the above structure provided by an embodiment of the present disclosure, and it may also be other structure that can be known by those skilled in the art, no limitation being placed here.

It should be noted that the concept, that the first anti-leakage circuit 103 and the second pull-down circuit 106 are provided on the basis of embodiments of the present disclosure, is not only suitable for solving the technical problem of electricity leakage of the pull-up node PU and the signal output terminal G(N) in the shift register units illustrated in FIGS. 2A and 2B provided by an embodiment of the present disclosure, but also applicable to restrain a pull-up node PU and a signal output terminal G(N) in shift register units of other structure that are well-known by those skilled in the art from engendering leakage of electricity, no specific limitation being placed here.

It should be noted that, in the description of embodiments of the present disclosure, the first node P1, the second node P2, the third node P3, the pull-up node PU and the pull-down node PD do not represent the components that exist actually, and instead, they indicate the junctions of related electrical connection in a circuit diagram.

It is to be noted that, switch transistors in embodiments of the present disclosure may be thin film transistors (TFTs), field effect transistors (e.g., Metal Oxide Semiconductor (MOS) field effect transistors) or other switching devices with the same characteristics, and in each of embodiments of the present disclosure, descriptions are given with thin film transistors as examples. The source and drain electrodes of a transistor used here may be symmetrical in structure, and so its source and drain electrodes may have no difference in structure. In embodiments of the present disclosure, for the sake of distinguishing two electrodes of a transistor except for the gate electrode, one of the electrodes is directly described as a first electrode and the other one of the electrodes is directly described as a second electrode.

In addition, transistors in embodiments of the present disclosure are all illustrated by taking an N-type transistor as an example, and in this case, the first electrode of the transistor is a drain electrode, and the second electrode of the transistor is a source electrode. It should be noted that, the present disclosure includes, but is not limited thereto. For example, one or more transistors in a shift register unit provided by an embodiment of the present disclosure may adopt a P-type transistor(s) as well, and in this case, the first electrode of the transistor is a source electrode, and the second electrode of the transistor is a drain electrode. It is only necessary to make the connection of electrodes of a transistor of the selected type correspondingly with reference to electrodes of a corresponding transistor in an embodiment of the present disclosure, and to cause a corresponding voltage terminal to provide a corresponding high or low voltage. When an N-type transistor is used, Indium Gallium Zinc Oxide (IGZO) may be used for an active layer of thin film transistor, and as compared with the case where Low Temperature Poly Silicon (LTPS) or amorphous silicon (such as hydrogenated amorphous silicon) is used as an active layer of thin film transistor, it is possible to effectively reduce the size of transistors and to prevent leakage current.

Based on the same concept, according to an embodiment of the present disclosure, there is further provided a driving method of any of the above shift register units. Because the principle of the driving method to solve the problem is the same as the principle of the above shift register unit to solve the problem, implementation of the driving method provided by an embodiment of the present disclosure may make reference to the implementation of the above shift register unit provided by an embodiment of the present disclosure, and repetitions are omitted.

For example, for the shift register unit illustrated in FIG. 2A provided by an embodiment of the present disclosure, a driving method is provided by an embodiment of the present disclosure, and as illustrated in FIG. 3A, it may include the following steps:

Step S301: in a first stage, the input circuit provides a signal of the first signal input terminal to the pull-up node via the first node under the control of the first signal input terminal; the first anti-leakage circuit provides a signal of the pull-up node to the first node and the second node under the control of the pull-up node; and the output circuit supplies a signal of the first clock signal input terminal to the signal output terminal under the control of the pull-up node;

Step S302: in a second stage, the first anti-leakage circuit provides a signal of the pull-up node to the first node and the second node under the control of the pull-up node; and the output circuit supplies a signal of the first clock signal input terminal to the signal output terminal under the control of the pull-up node;

Step S303: in a third stage, the reset circuit supplies a signal of the first voltage input terminal to the pull-up node via the second node under the control of the second signal input terminal.

In a specific implementation, for the sake of realizing the reset of the signal output terminal, the following step may also be performed at the first stage (step S301) and the third stage (step S303) in the driving method provided by an embodiment of the present disclosure: the first pull-down circuit supplies a signal of the first voltage input terminal to the signal output terminal via the third node under the control of the second clock signal terminal.

In a specific implementation, for the sake of restraining the signal output terminal from engendering charge leakage through a transistor connected with it, the following step may also be performed at the output stage (i.e., the second stage, step S302) in the above driving method provided by an embodiment of the present disclosure: the second pull-down circuit supplies a signal of the signal output terminal to the third node under the control of the signal output terminal.

Figure 3B:
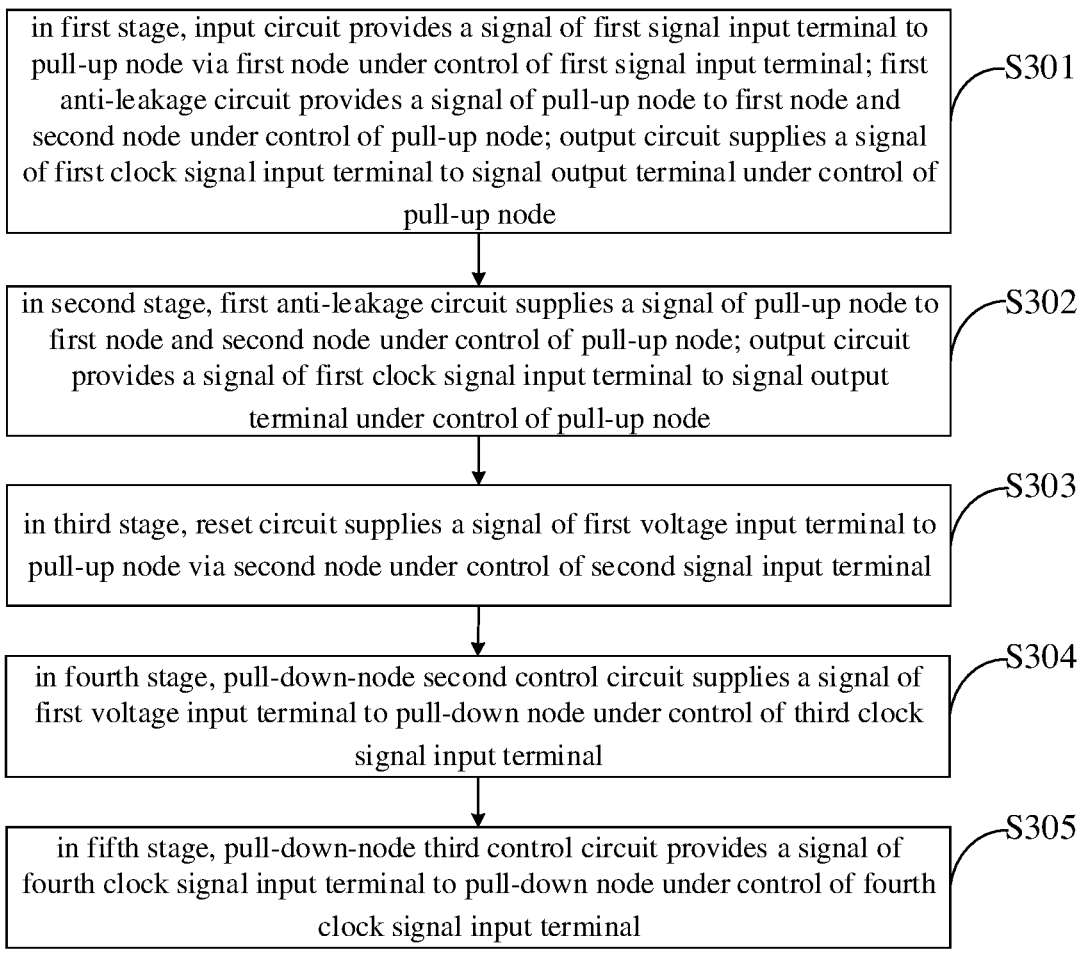
FIG. 3B is a flowchart illustrating driving method of the shift register unit illustrated in FIG. 2B provided by an embodiment of the present disclosure.

In addition, for the shift register unit illustrated in FIG. 2B provided by an embodiment of the present disclosure, a driving method is provided by an embodiment of the present disclosure, as illustrated in FIG. 3B, may include the following steps:

Step S301: in a first stage, the input circuit provides a signal of the first signal input terminal to the pull-up node via the first node under the control of the first signal input terminal; the first anti-leakage circuit provides a signal of the pull-up node to the first node and the second node under the control of the pull-up node; and the output circuit supplies a signal of the first clock signal input terminal to the signal output terminal under the control of the pull-up node;

Step S302: in a second stage, the first anti-leakage circuit provides a signal of the pull-up node to the first node and the second node under the control of the pull-up node; and the output circuit supplies a signal of the first clock signal input terminal to the signal output terminal under the control of the pull-up node;

Step S303: in a third stage, the reset circuit supplies a signal of the first voltage input terminal to the pull-up node via the second node under the control of the second signal input terminal;

Step S304: in a fourth stage, the pull-down-node second control circuit provides a signal of the first voltage input terminal to the pull-down node under the control of the third clock signal input terminal; and Step S305: in a fifth stage, the pull-down-node third control circuit supplies a signal of the fourth clock signal input terminal to the pull-down node under the control of the fourth clock signal input terminal.

In a specific implementation, for the sake of realizing the reset of the pull-down node, the following step may also be performed at the first stage (step S301) in the driving method provided by an embodiment of the present disclosure: the pull-down-node first control circuit supplies a signal of the first voltage input terminal to the pull-down-node under the joint control of the first signal input terminal and the pull-up node.

In a specific implementation, for the sake of restraining the signal output terminal from engendering charge leakage through a transistor connected with the signal output terminal and maintaining the low potential of the pull-down node, the following steps may also be performed at the second stage (step S302) in the above driving method provided by an embodiment of the present disclosure: the second pull-down circuit supplies a signal of the signal output terminal to the third node under the control of the signal output terminal; and the pull-down-node first control circuit supplies a signal of the first voltage input terminal to the pull-down node under the control of the pull-up node.

In a specific implementation, for the sake of realizing the reset of the signal output terminal, the following step may also be performed at the third stage (step S303) in the driving method provided by an embodiment of the present disclosure: the first pull-down circuit supplies a signal of the first voltage input terminal to the signal output terminal via the third node under the control of the second clock signal input terminal.

In a specific implementation, in order to release the static electricity accumulated at the pull-up node and the signal output terminal, following steps may also be performed at the fifth stage (step S305) in the above driving method provided by an embodiment of the present disclosure: the pull-up-node de-noising circuit provides a signal of the pull-up node to the second node under the control of the pull-down node; and the signal-output-terminal de-noising circuit provides a signal of the signal output terminal to the third node under the control of the pull-down node.

In order to understand technical schemes of the present disclosure better, the working process of the shift register units provided by the present disclosure will be described below with reference to two specific embodiments, respectively.

Embodiment 1

Figure 4A:
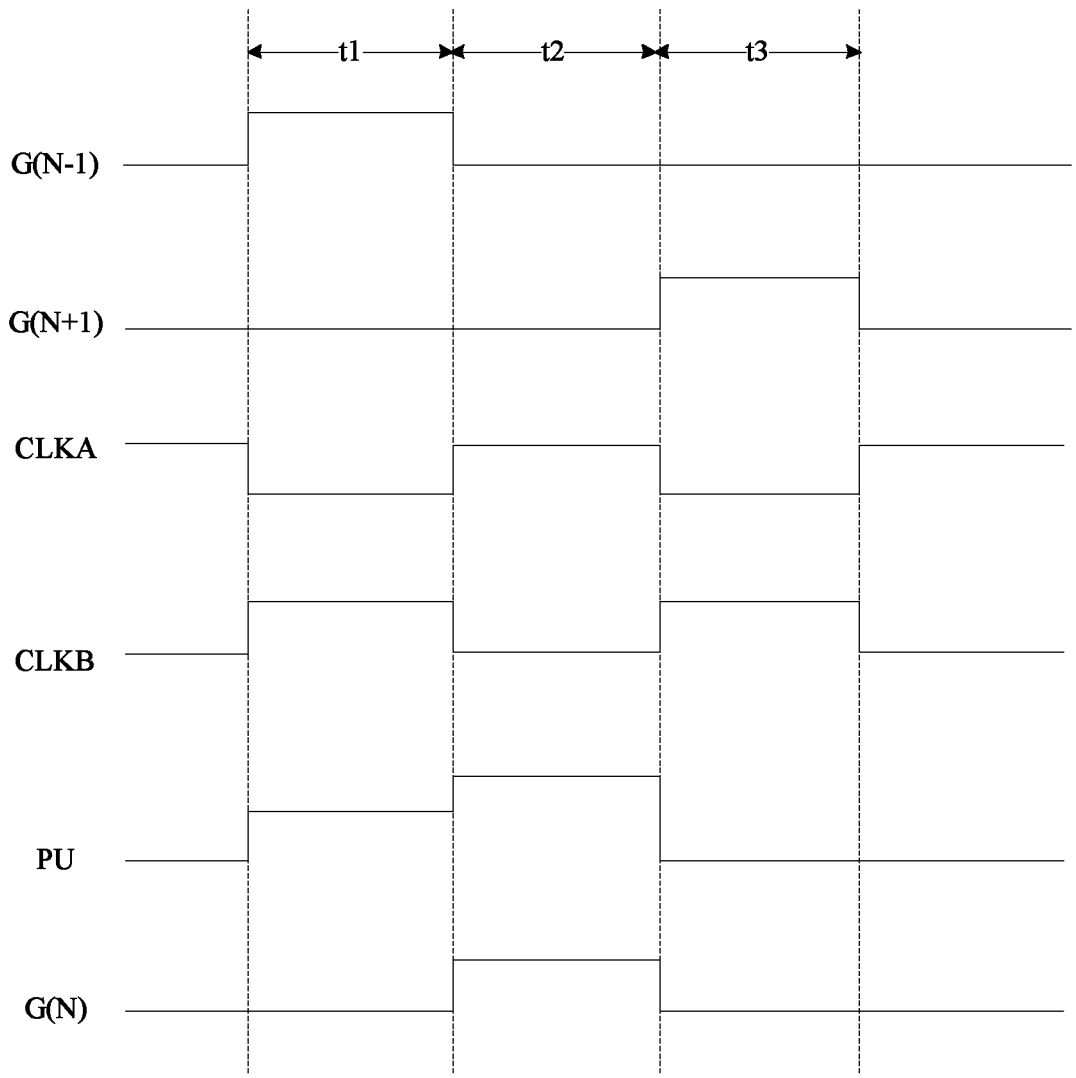
FIG. 4A is a work timing diagram of the shift register unit illustrated in FIG. 2A provided by an embodiment of the present disclosure.

FIG. 2A is a structurally schematic view illustrating a shift register unit provided by Embodiment 1 of the present disclosure. In the shift register unit illustrated in FIG. 2A, all switch transistors are N-type transistors, and each of the N-type transistors is switched on under the action of a high level, and switch off under the action of a low level. The corresponding working timing diagram is illustrated in FIG. 4A, and for example, a first stage t1, a second stage t2 and a third stage t3 of the working timing diagram illustrated in FIG. 4A are chosen as examples for detailed description.

The first stage t1: the first signal input terminal G(N−1) is at a high level, the second signal input terminal G(N+1) is at a low level, the first clock signal input terminal CLKA is at a low level, and the second clock signal input terminal CLKB is at a high level.

The first switch transistor M1, the fourth switch transistor M4, the fifth switch transistor M5, the sixth switch transistor M6, the seventh switch transistor M7 and the eighth switch transistor M8 are all in a switched-on state; and the second switch transistor M2, the third switch transistor M3, and the ninth switch transistor M9 are all in a switch-off state. The high-level signal of the first signal input terminal G(N−1) is supplied to the pull-up node PU via the switched-on first switch transistor M1, and meanwhile the capacitor C starts to be charged. The high-level signal of the pull-up node PU is written to a drain electrode of the first switch transistor M1 through the switched-on fourth switch transistor M4, and the source electrode of the first switch transistor M1 is connected to the pull-up node PU, so that the potential difference between the source electrode and drain electrode of the first switch transistor M1 is relatively small. Thus, it is avoided that the pull-up node PU produces a leakage current through the first switch transistor M1. At the same time, the high-level signal of the pull-up node PU is also written to the second node P2 (i.e., a source electrode of the third switch transistor M3) via the switched-on fifth switch transistor M5, and the drain electrode of the third switch transistor M3 is connected to the pull-up node PU, so that the potential difference between the source electrode and drain electrode of the third switch transistor M3 is relatively small. Thus, it is avoided that the pull-up node PU produces a leakage current through the third switch transistor M3. Furthermore, because the drain electrode of the fourth switch transistor M4 is connected to the pull-up node PU, the source electrode of the fourth switch transistor M4 is connected to the first node P1, the source electrode of the fifth switch transistor M5 is connected to the pull-up node PU, and the drain electrode of the fifth switch transistor M5 is connected to the second node P2, both the potential difference between the source electrode and drain electrode of the fourth switch transistor M4 and potential difference between the source electrode and drain electrode of the fifth switch transistor M5 are relatively low as well, the pull-up node PU is restrained from generating a leakage current through the four switch transistor M4 and the fifth switch transistor M5. In addition, in this stage, the low-level signal of the first clock signal input terminal CLKA is supplied to the signal output terminal G(N) via the switched-on sixth switch transistor M6, so as to pull down the potential of the signal output terminal G(N) lower. In order to prevent the influence of impurity charges and so on, for example, the low-level signal of the first voltage input terminal VGL may be supplied to the signal output terminal G(N) via the switched-on seventh switch transistor M7 and the switched-on eighth switch transistor M8 in sequence, so as to further lower the potential of the signal output terminal G(N).

The second stage t2: the first signal input terminal G(N−1) is at a low level, the second signal input terminal G(N+1) is at a low level, the first clock signal input terminal CLKA is at a high level, and the second clock signal input terminal CLKB is at a low level.

The fourth switch transistor M4, the fifth switch transistor M5, the sixth switch transistor M6 and the ninth switch transistor M9 are all in a switched-on state; the first switch transistor M1, the second switch transistor M2, the third switch transistor M3, the seventh switch transistor M7 and the eighth switch transistor M8 are all in a switch-off state. At this stage, due to the existence of capacitor C, the pull-up node PU continues to be kept at a high level, and the potential of the pull-node PU is increased further due to the bootstrap effect of the capacitor C. The sixth switch transistor M6 is fully turned on, and a high-level signal of the first clock signal input terminal CLKA is provided to the signal output terminal G(N) via the switched-on sixth switch transistor M6, so that the signal output terminal G(N) provides a gate ON signal to a gate line connected with the signal output terminal G(N). Based on the same principle as in the above first stage, for each of the first switch transistor M1, the third switch transistor M3, the fourth switch transistor M4 and the fifth switch transistor M5, their respective source electrode and drain electrode are at higher potentials, so that the potential difference between their respective source electrode and drain electrode is relatively low. Consequently, this restrains leakage current from generating between their respective source electrode and drain electrode, and avoids the pull-up node PU from engendering leakage of electricity with the aid of the first switch transistor M1, the third switch transistor M3, the fourth switch transistor M4 and the fifth switch transistor M5 that are connected with pull-up node PU. In addition, the switched-on ninth switch transistor M9 can push the potential of the third node P3 (that is, the source electrode of the eighth switch transistor M8) higher, so the potential difference between the source electrode and drain electrode of the eighth switch transistor M8 is relatively low, Thus, charges of the signal output terminal G(N) are restrained from leaking via the eighth switch transistor M8 connected to the signal output terminal G(N). Moreover, because the source electrode of the ninth switch transistor M9 is connected to the signal output terminal G(N), and the drain electrode of the ninth switch transistor M9 is connected to the third node P3, the potential difference between the source electrode and drain electrode of the ninth switch transistor M9 is also lower. This effectively restrains charges of the signal output terminal G(N) from leaking via the ninth switch transistor M9 connected to the signal output terminal G(N).

As can be seen from the above description, in the second stage t2, by means of pushing the potential difference between the source electrode and drain electrode of each switch transistor connected to the pull-up node PU lower, the pull-up node PU is restrained from engendering leakage of electricity through the switch transistor connected to the pull-up node PU; furthermore, by means of pushing the potential difference between the source electrode and drain electrode of each switch transistor connected to the signal output terminal G(N) lower, the signal output terminal is restrained from engendering leakage of electricity through the switch transistors connected therewith. Thus, the accuracy and stability of output of a gate ON signal from the shift register unit are improved.

The third stage t3: the first signal input terminal G(N−1) is at a low level, the second signal input terminal G(N+1) is at a high level, the first clock signal input terminal CLKA is at a low level, and the second clock signal input terminal CLKB is at a high level.

The second switch transistor M2, the third switch transistor M3, the seventh switch transistor M7 and the eighth switch transistor M8 are all in a switched-on state; and the first switch transistor M1, the fourth switch transistor M4, the fifth switch transistor M5, the sixth switch transistor M6 and the ninth switch transistor M9 are all in a switch-off state. The low-level signal of the first voltage input terminal VGL is supplied to the pull-up node PU via the switched-on second switch transistor M2 and the switched-on third switch transistor M3 in sequence, so potential of the pull-up node PU is pulled down to complete resetting. At the same time, the low-level signal of the first voltage input terminal VGL is supplied to the signal output terminal G(N) via the switched-on seventh switch transistor M7 and the switched-on eighth switch transistor M8 in sequence, and this makes the potential of the signal output terminal G(N) be pulled down to complete resetting.

In subsequent time periods, the shift register unit will repeat the above working process of t1~t3.

Embodiment 2

Figure 4B:
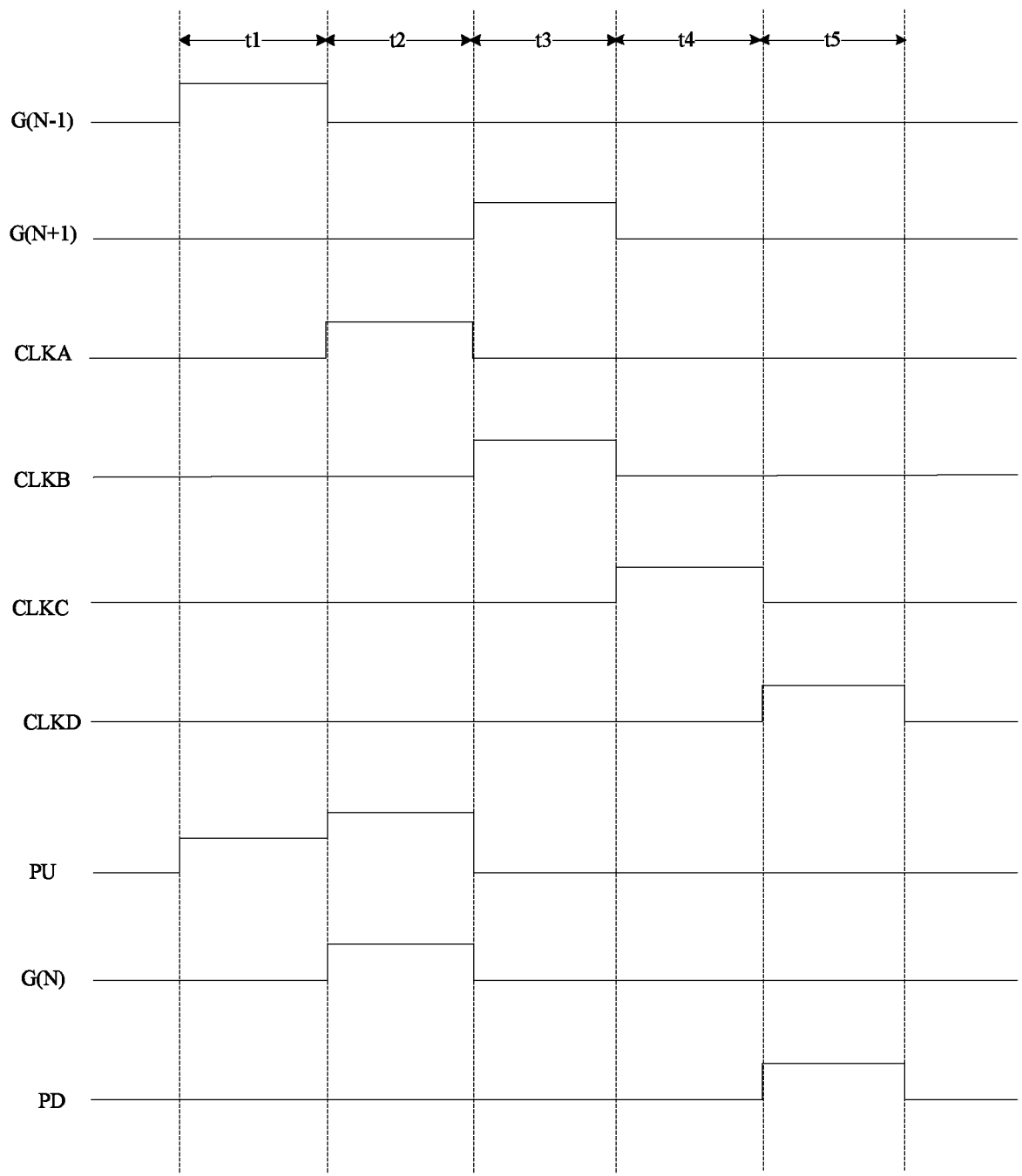
FIG. 4B is a work timing diagram of the shift register unit illustrated in FIG. 2B provided by an embodiment of the present disclosure.

FIG. 2B is a structurally schematic view illustrating a shift register unit provided by Embodiment 2 of the present disclosure. In the shift register unit illustrated in FIG. 2B, all switch transistors are N-type transistors, and each of the N-type transistors is switched on under the action of a high level, and switch off under the action of a low level. The corresponding working timing diagram is illustrated in FIG. 4B, and for example, a first stage t1, a second stage t2, a third stage t3, a fourth stage t4, and a fifth stage t5 of the working timing diagram illustrated in FIG. 4B are chosen as examples for detailed description.

The first stage t1: the first signal input terminal G(N−1) is at a high level, the second signal input terminal G(N+1) is at a low level, the first clock signal input terminal CLKA is at a low level, the second clock signal input terminal CLKB is at a low level, the third clock signal input terminal CLKC is at a low level and the fourth clock signal input terminal CLKD is at a low level.

The first switch transistor M1, the fourth switch transistor M4, the fifth switch transistor M5, the sixth switch transistor M6, the twelfth switch transistor M12, and the thirteenth switch transistor M13 are all in a switched-on state; the second switch transistor M2, the third switch transistor M3, the seventh switch transistor M7, the eighth switch transistor M8, the ninth switch transistor M9, the tenth switch transistor M10, the eleventh switch transistor M11, the fourteenth switch transistor M14 and the fifteenth switch transistor M15 are all in a switch-off state. The high-level signal of the first signal input terminal G(N−1) is supplied to the pull-up node PU via the switched-on first switch transistor M1, and the low-level signal of the first clock signal input terminal CLKA is supplied to the signal output terminal G(N) via the switched-on sixth switch transistor M6, so as to pull down the potential of the signal output terminal G(N) lower. Based on the same principle as in the above Embodiment 1, for each of the first switch transistor M1, the third switch transistor M3, the fourth switch transistor M4, the fifth switch transistor M5 and the eleventh switch transistor M11, their respective source electrode and drain electrode have higher potential, so that the potential difference between their respective source electrode and drain electrode is relatively low. Consequently, this restrains leakage current from generating between their respective source electrode and drain electrode, and avoids the pull-up node PU from engendering leakage of charge with the aid of the first switch transistor M1, the third switch transistor M3, the fourth switch transistor M4, the fifth switch transistor M5 and the eleventh switch transistor M11 that are connected with the pull-up node PU. In addition, at this stage, a low-level signal of the first voltage input terminal VGL is written to the pull-down node PD via the switched-on twelfth switch transistor M12 and the thirteenth switch transistor M13, so as to lower the potential of the pull-down node PD.

The second stage t2: the first signal input terminal G(N−1) is at a low level, the second signal input terminal G(N+1) is at a low level, the first clock signal input terminal CLKA is at a high level, the second clock signal input terminal CLKB is at a low level, the third clock signal input terminal CLKC is at a low level and the fourth clock signal input terminal CLKD is at a low level.

The fourth switch transistor M4, the fifth switch transistor M5, the sixth switch transistor M6, the ninth switch transistor M9 and the thirteenth switch transistor M13 are all in a switched-on state; the first switch transistor M1, the second switch transistor M2, the third switch transistor M3, the seventh switch transistor M7, the eighth switch transistor M8, the tenth switch transistor M10, the eleventh switch transistor M11, the twelfth switch transistor M12, the fourteenth switch transistor M14 and the fifteenth switch transistor M15 are all in a switch-off state. At this stage, due to the existence of capacitor C, the pull-up node PU continues to be kept at a high level, and the potential of the pull-node PU is raised further due to the bootstrap effect of the capacitor C. The sixth switch transistor M6 is fully turned on, and the high-level signal of the first clock signal input terminal CLKA is provided to the signal output terminal G(N) via the switched-on sixth switch transistor M6, so that the signal output terminal G(N) provides a gate ON signal to a gate line connected with the signal output terminal G(N). Based on the same principle as in the above Embodiment 1, for each of the first switch transistor M1, the third switch transistor M3, the fourth switch transistor M4, the fifth switch transistor M5 and the eleventh switch transistor M11, their respective source electrode and drain electrode have higher potential, so the potential difference between their respective source electrode and drain electrode is relatively low. Consequently, this restrains leakage current from generating between their respective source electrode and drain electrode, and avoids the pull-up node PU from engendering leakage of charge with the aid of the first switch transistor M1, the third switch transistor M3, the fourth switch transistor M4, the fifth switch transistor M5 and the eleventh switch transistor M11 that are connected with the pull-up node PU. Further, based on the same principle as in the above Embodiment 1, the potential difference between the source electrode and drain electrode of the eighth switch transistor M8, the potential difference between the source electrode and drain electrode of the ninth switch transistor M9 and the potential difference between the source electrode and drain electrode of the tenth switch transistor M10 are all relatively low, thus restraining charges of the signal output terminal G(N) from leaking via the eighth switch transistor M8, the ninth switch transistor M9 and the tenth switch transistor M10 that are connected with the signal output terminal G(N).

As can be seen from the above description, in the second stage t2, by means of lowering the potential difference between the source electrode and drain electrode of each switch transistor connected to the pull-up node PU, the pull-up node PU is restrained from engendering leakage of electricity through the switch transistors connected to the pull-up node PU; furthermore, by means of lowering the potential difference between the source electrode and drain electrode of each switch transistor connected to the signal output terminal G(N), the signal output terminal G(N) is restrained from engendering leakage of electricity through the switch transistors connected with the signal output terminal G(N). Thus, the accuracy and stability of output of a gate ON signal from the shift register unit are improved.

The third stage t3: the first signal input terminal G(N−1) is at a low level, the second signal input terminal G(N+1) is at a high level, the first clock signal input terminal CLKA is at a low level, the second clock signal input terminal CLKB is at a high level, the third clock signal input terminal CLKC is at a low level and the fourth clock signal input terminal CLKD is at a low level.

The second switch transistor M2, the third switch transistor M3, the seventh switch transistor M7 and the eighth switch transistor M8 are all in a switched-on state; the first switch transistor M1, the fourth switch transistor M4, the fifth switch transistor M5, the sixth switch transistor M6, the ninth switch transistor M9, the tenth switch transistor M10, the eleventh switch transistor M11, the twelfth switch transistor M12, the thirteenth switch transistor M13, the fourteenth switch transistor M14, and the fifteenth switch transistor M15 are all in a switch-off state. The low-level signal of the first voltage input terminal VGL is supplied to the pull-up node PU via the switched-on second switch transistor M2 and the switched-on third switch transistor M3 in sequence, so the potential of the pull-up node PU is pulled down to complete resetting. At the same time, the low-level signal of the first voltage input terminal VGL is also supplied to the signal output terminal G(N) via the switched-on seventh switch transistor M7 and the switched-on eighth switch transistor M8 in sequence, and this makes the potential of the signal output terminal G(N) be pulled down to complete resetting. At this stage, the signal input terminal G(N) is kept at low potential.

The fourth stage t4: the first signal input terminal G(N−1) is at a low level, the second signal input terminal G(N+1) is at a low level, the first clock signal input terminal CLKA is at a low level, the second clock signal input terminal CLKB is at a low level, the third clock signal input terminal CLKC is at a high level and the fourth clock signal input terminal CLKD is at a low level.

The fourteenth switch transistor M14 is in a switched-on state; the first switch transistor M1, the second switch transistor M2, the third switch transistor M3, the fourth switch transistor M4, the fifth switch transistor M5, the sixth switch transistor M6, the seventh switch transistor M7, the eighth switch transistor M8, the ninth switch transistor M9, the tenth switch transistor M10, the eleventh switch transistor M11, the twelfth switch transistor M12, the thirteenth switch transistor M13 and the fifteenth switch transistor M15 are all in a switch-off state. The low-level signal of the first voltage input terminal VGL is written to the pull-down node PD via the switched-on fourteenth switch transistor M14, so the pull-down node PD is set to low potential. At this stage, the signal input terminal G(N) is kept at low potential.

The fifth stage t5: the first signal input terminal G(N−1) is at a low level, the second signal input terminal G(N+1) is at a low level, the first clock signal input terminal CLKA is at a low level, the second clock signal input terminal CLKB is at a low level, the third clock signal input terminal CLKC is at a low level, and the fourth clock signal input terminal CLKD is at a high level.

The tenth switch transistor M10, the eleventh switch transistor M11 and the fifteenth switch transistor M15 are all in a switched-on state; the first switch transistor M1, the second switch transistor M2, the third switch transistor M3, the fourth switch transistor M4, the fifth switch transistor M5, the sixth switch transistor M6, the seventh switch transistor M7, the eighth switch transistor M8, the ninth switch transistor M9, the twelfth switch transistor M12, the thirteenth switch transistor M13 and the fourteenth switch transistor M14 are all in a switch-off state. The fifteenth switch transistor M15 is switched on under the control of the fourth clock signal input terminal CLKD, and the high-level signal of the fourth clock signal input terminal CLKD is written to the pull-down node PD via the switched-on fifteenth switch transistor M15; therefore, the tenth switch transistor M10 and the eleventh switch transistor M11 can be turned on. The static electricity accumulated at the pull-up node PU is written to the second node P2 through the switched-on eleventh switch transistor M11, so the eleventh switch transistor M11 and the second switch transistor M2 output the static electricity accumulated at the pull-up node PU by effect of coupling. Thus, the low potential of the pull-up node PU is guaranteed. The static electricity accumulated at the signal output terminal G(N) is written into the third node P3 via the switched-on tenth switch transistor M10, so the tenth switch transistor M10 and the seventh switch transistor M7 output, by the effect of coupling, the static electricity accumulated at the signal output terminal G(N). Thus, low potential of the signal output terminal G(N) can be maintained.

In subsequent time periods, the shift register unit will repeat the above working process of t1~t5.

Based on the same concept, according to an embodiment of the present disclosure, there is provided a gate drive circuit, and the gate drive circuit includes a plurality of cascaded shift register units. The first signal input terminal of a shift register unit at the first level is connected to a frame trigger signal terminal, and except for the shift register unit at the first level, the first signal input terminal of the shift register unit at each of the remaining levels is connected with the signal output terminal of the shift register unit at the previous level, respectively. In addition to a shift register unit at the last level, the second signal input terminal of the shift register unit at each of the remaining levels is connected to the signal output terminal of the shift register units at the next level, respectively.

Figure 5A:
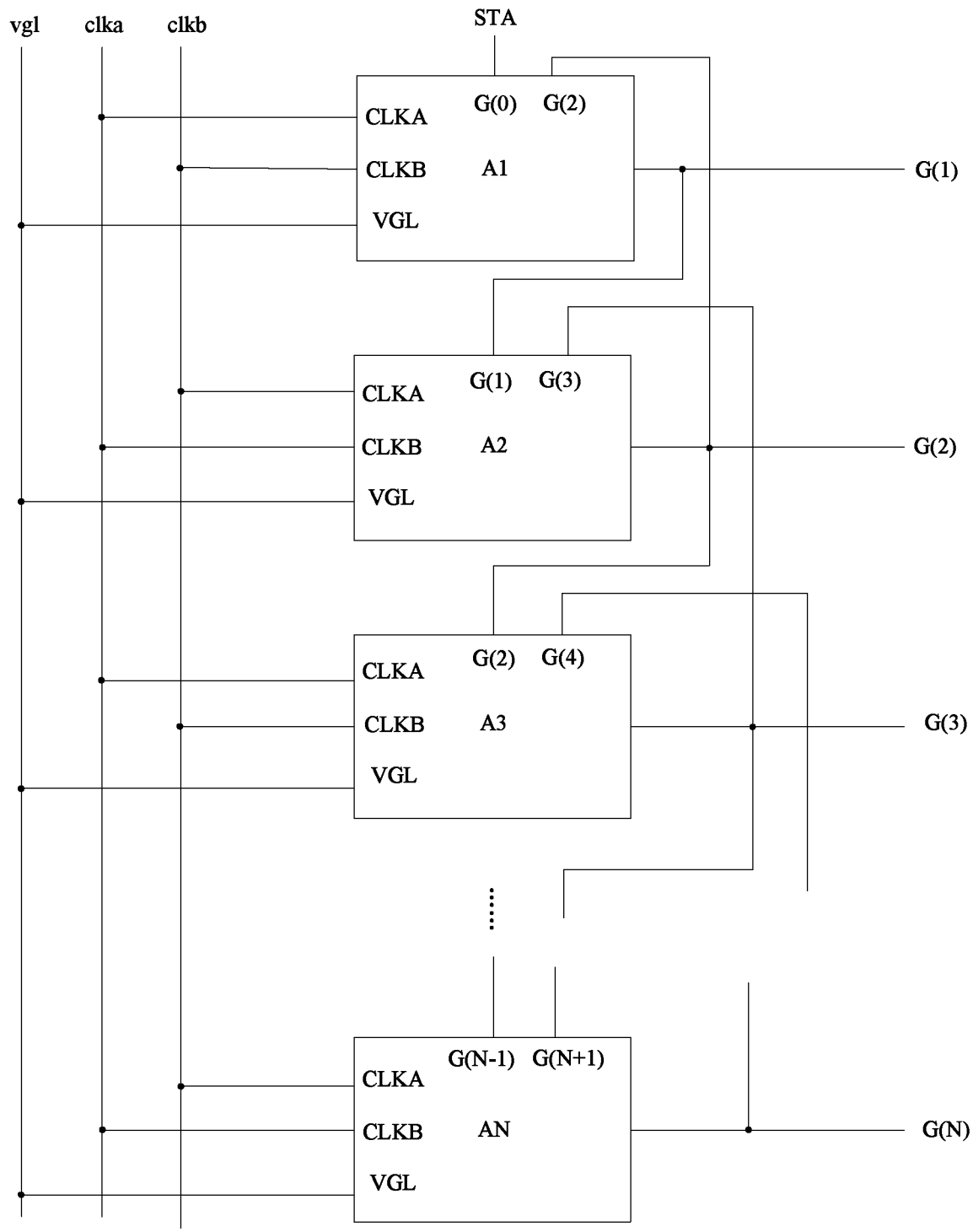
FIG. 5A and FIG. 5B are structurally schematic views illustrating a gate drive circuit provided by an embodiment of the present disclosure, respectively.
Figure 5B:
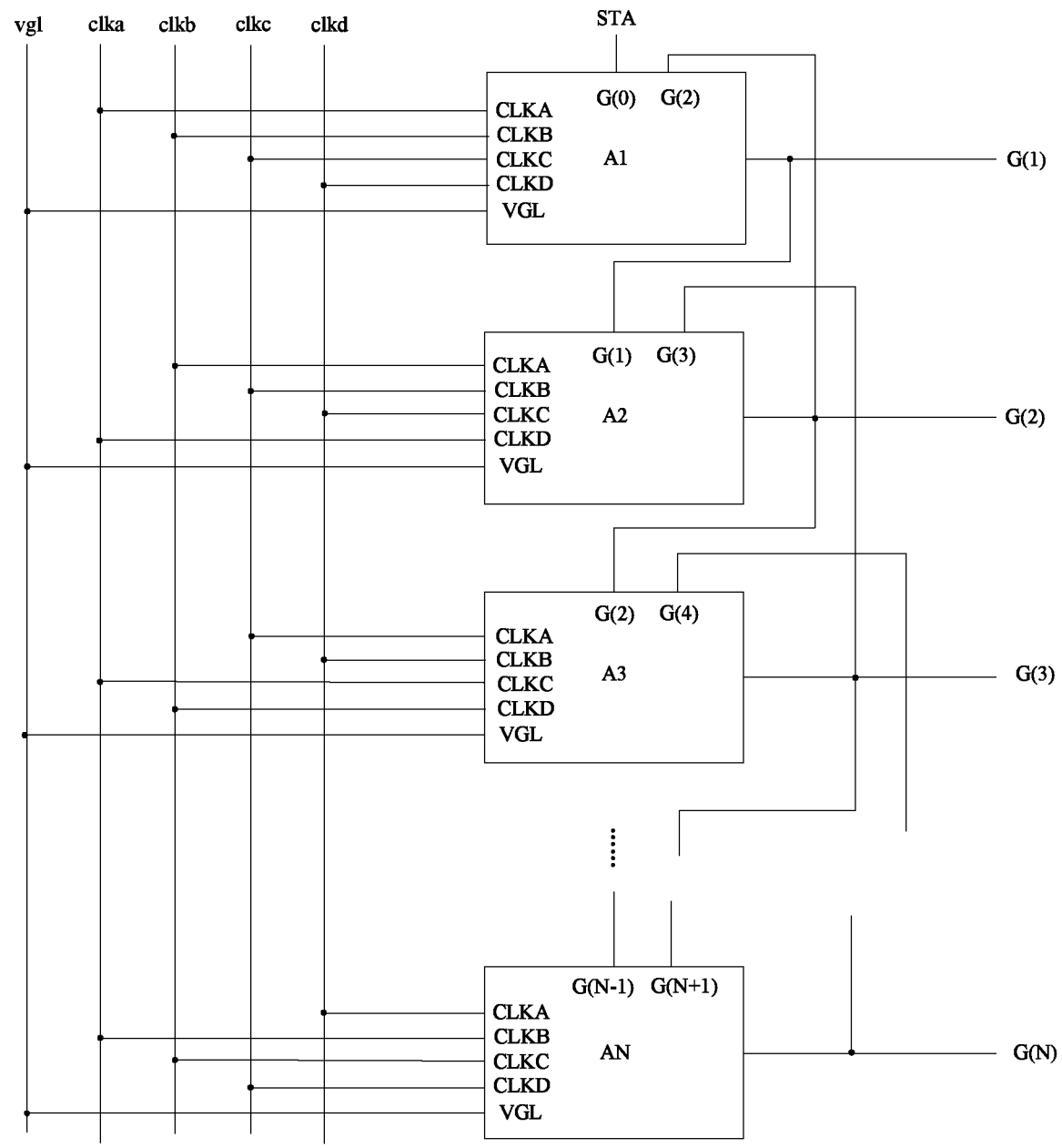

For example, as illustrated in FIGS. 5A and 5B, the gate drive circuit includes a plurality of cascaded shift register units: A1, A2, A3, . . . , AN (i.e., N shift register units), and G(N−1) is a signal output terminal of the shift register unit at the previous level, G(N+1) is a signal output terminal of the shift register unit at the next level. For example, G(N−1) of the second shift register unit A2 is the signal output terminal G(1) of the first shift register unit A1, and G(N+1) of the second shift register unit A2 is the signal output terminal G(3) of the third shift register unit A3. For example, for the first shift register unit A1, the signal of a frame trigger signal terminal STA (i.e., the output signal of the previous-level dummy unit) is used as G(N−1) (i.e., G(0)) of the first shift register unit A1.

For example, the specific structure of each of shift register units in the above gate drive circuit is the same as the above shift register unit of the present disclosure in terms of function and structure, and repetitions are omitted.

For example, in the above-mentioned gate drive circuit provided by an embodiment of the present disclosure, as illustrated in FIG. 5A, a first voltage input terminal VGL of a shift register unit at each level is connected to a first voltage signal line vgl; the first clock signal input terminal CLKA of the shift register unit at the (2n−1)th level is each connected with a first clock signal line clka, and the first clock signal input terminal CLKA of the shift register unit at the (2n)th level is each connected with a second clock signal line clkb; the second clock signal input terminal of the shift register unit at the (2n−1)th level is each connected with the second clock signal line clkb; and the second clock signal input terminal CLKB of the shift register unit at the (2n)th level is each connected with the first clock signal line clka. Furthermore, the clock signal on the first clock signal line clka is opposite to the clock signal on the second clock signal line clkb in phase, that is, when the first clock signal line clka outputs a high level, the second clock signal line clkb outputs a low level; when the first clock signal line clka outputs a low level, the second clock signal line clkb outputs a high level. Here, n is an integer greater than 0.

For example, in the above-mentioned gate drive circuit provided by an embodiment of the present disclosure, as illustrated in FIG. 5B, the first voltage input terminal VGL of the shift register unit at each level is connected to a first voltage signal line vgl, and the connection relationship of the first clock signal input terminal CLKA, the second clock signal input CLKB, the third clock signal input CLKC and the fourth clock signal input CLKD is as follows, and the rest can be deduced in the same way.

Of the shift register unit at the (4n−3)th level, the first clock signal input terminal CLKA is each connected with the first clock signal line clka, the second clock signal input terminal CLKB is each connected with the second clock signal line clkb, the third clock signal input terminal CLKC is each connected with the third clock signal line clkc, and the fourth clock signal input terminal CLKD is each connected with the fourth clock signal line clkd.

Of the shift register unit at the (4n−2)th level, the first clock signal input terminal CLKA is each connected with the second clock signal line clkb, the second clock signal input terminal CLKB is each connected with the third clock signal line clkc, the third clock signal input terminal CLKC is each connected with the fourth clock signal line clkd, and the fourth clock signal input terminal CLKD is each connected with the first clock signal line clka.

Of the shift register unit at the (4n−1)th level, the first clock signal input terminal CLKA is each connected with the third clock signal line clkc, the second clock signal input terminal CLKB is each connected with the fourth clock signal line clkd, the third clock signal input terminal CLKC is each connected with the first clock signal line clka, and the fourth clock signal input terminal CLKD is each connected with the second clock signal line clkb.

Of the shift register unit at the (4n)th level, the first clock signal input terminal CLKA is each connected with the fourth clock signal line clkd, the second clock signal input terminal CLKB is each connected with the first clock signal line clka, the third clock signal input terminal CLKC is each connected with the second clock signal line clkb, and the fourth clock signal input terminal CLKD is each connected with the third clock signal line clkc.

Here, h is an integer greater than 0.

For example, the effective level pulse width of the signals on the first clock signal line clka, second clock signal line clkb, third clock signal line clkc and the fourth clock signal line clkd accounts for ¼ of the frame time, respectively.

Based on the same concept, according to an embodiment of the present disclosure, there is further provided a display device, which includes the above gate drive circuit provided by an embodiment of the present disclosure. The display device may be a mobile phone, a tablet computer, a television set, a display, a notebook computer, a digital camera, a navigator, a smartwatch, a fitness wristband, a personal digital assistant, a self-service deposit/withdraw machine or any other display product or component with display function. As for other essential components of the display device that should be possessed as understood by those ordinarily skilled in the art, they are not elaborated here, and shall not be used as limitation of embodiments of the present disclosure. Implementation of the display device may make reference to the above embodiments of gate drive circuit, and repetitions are omitted.

Embodiments of the present disclosure provide a shift register unit and a driving method thereof, a gate drive circuit and a display device. The shift register unit includes an input circuit, a reset circuit, a first anti-leakage circuit and an output circuit; the input circuit is connected with a first signal input terminal, a first node and a pull-up node, and configured for providing signal of the first signal input terminal to the pull-up node via the first node under the control of the first signal input terminal; the reset circuit is connected with a second signal input terminal, a first voltage input terminal, a second node and the pull-up node, and configured for providing signal of the first voltage input terminal to the pull-up node via the second node under the control of the second signal input terminal; the first anti-leakage circuit is connected with the pull-up node, the first node and the second node, and configured for providing signal of the pull-up node to the first node and the second node under the control of the pull-up node; the output circuit is connected with the pull-up node, a first clock signal input terminal and a signal output terminal, and configured for providing signal of the first clock signal input terminal to the signal output terminal under the control of the pull-up node. Because the signal of the pull-up node is provided to the first node and the second node by the first anti-leakage circuit, internal potential difference among the input circuit, the reset circuit, and the first anti-leakage circuit is relatively small, the input circuit is connected with the pull-up node, the reset circuit is connected with the pull-up node and the second node simultaneously, and the first anti-leakage circuit is connected with the first node, the pull-up node and the second node simultaneously. Thus, the phenomenon is avoided that the pull-up node produces a leakage current through the first anti-leakage circuit, the input circuit and the reset circuit that are connected to the pull-up node, and the pull-up node is prevented from leaking electricity via a transistor connected to the pull-up node. Consequently, the stability of signal output of the output circuit is guaranteed.

It should be noted that, in this disclosure, relational terms such as first, second and so on are used only to distinguish one entity or operation from another entity or operation, and do not necessarily require or imply that any of such actual relationships or orders exists between these entities or operations.

Apparently, those skilled in the art can make various modifications and variants to the present disclosure without departing from the spirit and scope of the present disclosure. As such, provided that these modifications and variations of the present disclosure fall within the scope of claims of the present disclosure and their equivalent techniques, it is intended to embrace these modifications and variants in the present disclosure.

What are described above is related to the illustrative embodiments of the disclosure only and not limitative to the scope of the disclosure; the scopes of the disclosure are defined by the accompanying claims.

What is claimed is:

1. A shift register unit, comprising an input circuit, a reset circuit, a first anti-leakage circuit and an output circuit, wherein the input circuit is connected with a first signal input terminal, a first node and a first level control node, and configured for providing a signal of the first signal input terminal to the first level control node via the first node under control of the first signal input terminal;

the reset circuit is connected with a second signal input terminal, a first voltage input terminal, a second node and the first level control node, and configured for providing a signal of the first voltage input terminal to the first level control node via the second node under control of the second signal input terminal;

the first anti-leakage circuit is connected with the first level control node, the first node and the second node, and configured for providing a signal of the first level control node to the first node and the second node under control of the first level control node; and the output circuit is connected with the first level control node, a first clock signal input terminal and a signal output terminal, and configured for providing a signal of the first clock signal input terminal to the signal output terminal under control of the first level control node.

2. The shift register unit claimed as claim 1, wherein the input circuit includes a first switch transistor, a gate electrode of the first switch transistor is connected to the first signal input terminal, a first electrode of the first switch transistor is connected to the first signal input terminal via the first node, and a second electrode of the first switch transistor is connected to the first level control node.

3. The shift register unit claimed as claim 1, wherein the reset circuit Rides a second switch transistor and a third switch transistor, a gate electrode of the second switch transistor is connected to the second signal input terminal, a first electrode of the second switch transistor is connected to the second node, and a second electrode of the second switch transistor is connected to the first voltage input terminal; and a gate electrode of the third switch transistor is connected o the second signal input terminal, a first electrode of the third switch transistor is connected to the first level control node, and a second electrode of the third switch transistor is connected to the second node.

4. The shift register unit claimed as claim 1, wherein the first anti-leakage circuit includes a fourth switch transistor and a fifth switch transistor, both a gate electrode and a first electrode of the fourth switch transistor are connected with the first level control node, and a second electrode of the fourth switch transistor is connected to the first node; and both a gate electrode and a second electrode of the fifth switch transistor are connected with the first level control node, and a first electrode of the fifth switch transistor is connected to the second node.

5. The shift register unit claimed as claim 1, wherein the output circuit includes a sixth switch transistor and a capacitor, a gate electrode of the sixth switch transistor is connected with the first first level control node, a first electrode of the sixth switch transistor is connected to the first clock signal input terminal, and a second electrode of the sixth switch transistor is connected to the signal output terminal; and one end of the capacitor is connected to the first level control node, and other end of the capacitor is connected to the signal output terminal.

6. The shift register unit claimed as claim 1, further comprising a first pull-blown circuit,
   wherein the first pull-down circuit is connected with a second clock signal input terminal, the first voltage input terminal, the third node and the signal output terminal, and configured for supplying the signal of the first voltage input terminal to the signal output terminal via the third node under control of the second clock signal input terminal.

7. The shift register unit claimed as claim 6, wherein the first pull-down circuit includes a seventh switch transistor and an eighth switch transistor,
   a gate electrode of the seventh switch transistor is connected to the second clock signal input terminal, a first electrode of the seventh switch transistor is connected to the third node, and a second electrode of the seventh switch transistor is connected to the first voltage input terminal; and
   a gate electrode of the eighth switch transistor is connected to the second clock signal input terminal, a first electrode of the eighth switch transistor is connected to the signal output terminal, and the second electrode of the eighth switch transistor is connected to the third node.

8. The shift register unit claimed as claim 6, further comprising a second pull-down circuit,
   wherein the second pull-down circuit is connected to the signal output terminal and the third node, and configured for providing a signal of the signal output terminal to the third node under control of the signal output terminal.

9. The shift register unit claimed as claim 8, wherein the second pull-down circuit includes a ninth switch transistor,
   both a gate electrode and a second electrode of the ninth switch transistor are connected to the signal output terminal, and a first electrode of the ninth switch transistor is connected to the third node.

10. The shift register unit claimed as claim 6, further comprising a signal-output-terminal de-noising circuit, a pull-up-node de-noising circuit, a pull-down-node first control circuit, a pull-down-node second control circuit and a pull-down-node third control circuit,
    wherein the signal-output-terminal de-noising circuit is connected with the third node, the signal output terminal and a second level control node, and configured to supply the signal of the signal output terminal to the third node under control of the second level control node;
    the pull-up-node de-noising circuit is connected with the first level control node, the second node and the second level control node, and configured to supply the signal of the first level control node to the second node under control of the second level control node;
    the pull-down-node first control circuit is connected with the first signal input terminal, the first level control node, the second level control node and the first voltage input terminal, and configured for supplying the signal of the first voltage input terminal to the second level control node under control of one selected from the group consisting of the first signal input terminal and the first level control node;
    the pull-down-node second control circuit is connected with a third clock signal input terminal, the second level control node and the first voltage input terminal, and configured for supplying the signal of the first voltage input terminal to the second level control node under control of the third clock signal input terminal; and
    the pull-down-node third control circuit is connected with a fourth clock signal input terminal and the second level control node, and configured for providing a signal of the fourth clock signal input terminal to the second level control node under control of the fourth clock signal input terminal.

11. A gate drive circuit, comprising a plurality of cascaded shift register units each as claim 1, wherein
    a first signal input terminal of a shift register unit at a first level is connected with a frame trigger signal terminal;
    except for the shift register unit at the first level, a first signal input terminal of a shift register unit at each of the remaining levels is respectively connected to a signal output terminal of a shift register unit at a previous level that is adjacent to each of the remaining levels; and
    except for a shift register unit at a last level, a second signal input terminal of a shift register unit at each of the remaining levels is respectively connected to a signal output terminal of a shift register unit at a next level that is adjacent to each of the remaining levels.

12. A display device, comprising the gate drive circuit claimed as claim 11.

13. A driving method of the shift register unit claimed as claim 1, comprising:
    in a first stage, the input circuit supplying the signal of the first signal input terminal to the first level control node via the first node under control of the first signal input terminal; the first anti-leakage circuit supplying the signal of the first level control node to the first node and the second node under control of the first level control node; the output circuit supplying the signal of the first clock signal input terminal to the signal output terminal under control of the first level control node;
    in a second stage, the first anti-leakage circuit supplying the signal of the first level control node to the first node and the second node under control of the first level control node; the output circuit supplying the signal of the first clock signal input terminal to the signal output terminal under control of the first level control node; and
    in a third stage, the reset circuit providing he signal of the first voltage input terminal to the first level control node via the second node under control of the second signal input terminal.

14. The driving method claimed as claim 13, wherein in the first stage and the third stage, the method further comprises:
    the first pull-down circuit providing the signal of the first voltage input terminal to the signal output terminal via the third node under control of the second clock signal terminal.

15. The driving device claimed as claim 14, wherein in the second stage, the method further comprises:
    the second pull-down circuit providing the signal of the signal output terminal to the third node under control of the signal output terminal.

16. A driving method of the shift register unit claimed as claim 10, comprising:
    in a first stage, the input circuit supplying the signal of the first signal input terminal to the first level control node via the first node under control of the first signal input terminal; the first anti-leakage circuit supplying the signal of the first level control node to the first node and the second node under control of the first level control node; the output circuit supplying the signal of the first clock signal input terminal to the signal output terminal under control of the first level control node;

in a second stage, the first anti-leakage circuit supplying the signal of the first level control node to the first node and the second node under control of the first level control node; the output circuit supplying the signal of the first clock signal input terminal to the signal output terminal under control of the first level control node;

in a third stage, the reset circuit providing the signal of the first voltage input terminal to the first level control node via the second node under control of the second signal input terminal;

in a fourth stage, the pull-down-node second control circuit supplying the signal of the first voltage input terminal to the second level control node under control of the third clock signal input terminal; and in a fifth stage, the pull-down-node third control circuit providing a signal of the fourth clock signal input terminal to the second level control node under control of the fourth clock signal input terminal.

17. The driving method claimed as claim 16, wherein in the first stage, the method further comprises: the pull-down-node first control circuit providing the signal of the first voltage input terminal to the second level control node under joint control of the first signal input terminal and the first level control node.

18. The driving method claimed as claim 17, wherein in the second stage, the method further comprises: the second pull-down circuit supplying the signal of the signal output terminal to the third node under control of the signal output terminal; the pull-down-node first control circuit providing the signal of the first voltage input terminal to the second level control node under control of the first level control node.

19. The driving method claimed as claim 18, wherein in the third stage, the method further comprises: the first pull-down circuit supplying the signal of the first voltage input terminal to the signal output terminal via the third node under control of the second clock signal output terminal.

20. The driving method claimed as claim 18, wherein in the fifth stage, the method further comprises: the pull-up-node de-noising circuit providing the signal of the first level control node to the second node under control of the second level control node; the signal-output-terminal de-noising circuit supplying the signal of the signal output terminal to the third node under control of the second level control node.

* * * * *